(12) United States Patent
Moriya et al.

(10) Patent No.: US 7,715,616 B2
(45) Date of Patent: May 11, 2010

(54) PC BOARD INSPECTING METHOD AND APPARATUS AND INSPECTION LOGIC SETTING METHOD AND APPARATUS

(75) Inventors: Toshihiro Moriya, Nara (JP); Hirotaka Wada, Nara (JP); Takako Onishi, Kyoto (JP); Atsushi Shimizu, Yokohama (JP); Akira Nakajima, Otsu (JP)

(73) Assignee: OMRON Corporation, Kyoto (JP)

( * ) Notice: Subject to any disclaimer, the term of this patent is extended or adjusted under 35 U.S.C. 154(b) by 1018 days.

(21) Appl. No.: 11/358,914

(22) Filed: Feb. 21, 2006

(65) Prior Publication Data
US 2006/0204074 A1 Sep. 14, 2006

(30) Foreign Application Priority Data

Feb. 21, 2005 (JP) ............................. 2005-044079
Jan. 17, 2006 (JP) ............................. 2006-008676

(51) Int. Cl.
*G06K 9/00* (2006.01)
(52) U.S. Cl. ....................... 382/149; 382/145; 382/146; 382/150; 382/151; 382/164; 382/171; 382/173
(58) Field of Classification Search ................. 382/145, 382/146, 147, 149, 150, 151, 164, 171, 173
See application file for complete search history.

(56) References Cited

U.S. PATENT DOCUMENTS 6,487,307 B1 * 11/2002 Hennessey et al. .......... 382/149
6,515,470 B2    2/2003 Suzuki et al.
6,647,132 B1 * 11/2003 Montillo et al. ............. 382/108
7,031,510 B2 *  4/2006 Imamura et al. ............ 382/147
2001/0028733 A1 * 10/2001 Sasaki et al. ................ 382/149

FOREIGN PATENT DOCUMENTS

| JP | 02-078937 | 3/1990 |
| JP | 09-145633 | 6/1997 |
| JP | 2782759 B2 | 8/1998 |

(Continued)

OTHER PUBLICATIONS

Taiwanese Office Action issued in Taiwanese Application No. 095104114 dated Jan. 16, 2009 and English translation thereof, 5 pages.

(Continued)

*Primary Examiner*—Vikkram Bali
*Assistant Examiner*—Daniel Zeilberger
(74) *Attorney, Agent, or Firm*—Osha • Liang LLP

(57) ABSTRACT

A PC board inspecting method capable of detecting deviation of an IC component at high speed with small storage capacity utilizes inspection logic particular to a component to be inspected. The inspection logic includes a color condition for specifying a color appearing in the body of the component to be inspected. The component is radiated with a plurality of color rays at different angles of incidence. An image formed by reflection light of the color rays is captured, and an inspection image including at least part of an edge of the body of the component to be inspected is captured. By using the color condition, a component body area satisfying the color condition is extracted from the inspection image by an image process.

24 Claims, 15 Drawing Sheets

FOREIGN PATENT DOCUMENTS

| JP | 2004-213562 A | 7/2004 |
| TW | 548413 | 8/2003 |
| TW | 200409924 A | 6/2004 |

OTHER PUBLICATIONS

English abstract of TW548413 published Aug. 21, 2003, 1 page.
English abstract of TW200409924 published Jun. 16, 2004, 1 page.
Partial European Search Report issued in European Application No. EP 06 11 0203 dated Mar. 23, 2009, 4 pages.
Patent Abstracts of Japan, Publication No. 02216407, Publication Date: Aug. 29, 1990, 1 page.
Patent Abstracts of Japan, Publication No. 2004213562, Publication Date: Jul. 29, 2004, 1 page.
Extended European Search Report issued in European Application No. 06110203.4-2214 dated Jun. 10, 2009, 10 pages.
Patent Abstracts of Japan; Publication No. 02-078937; Date of publication: Mar. 19, 1990 (2 pages).
Patent Abstracts of Japan; Publication No. 09-145633; Date of Publication: Jun. 6, 1997 (2 pages).

\* cited by examiner

PC BOARD INSPECTING METHOD AND APPARATUS AND INSPECTION LOGIC SETTING METHOD AND APPARATUS

BACKGROUND OF THE INVENTION

1. Field of the Invention

The present invention relates to an inspection technique for detecting the deviation of an IC component mounted on a PC board and a technique for generating inspection logic for use in the inspection.

2. Description of the Related Art

Hitherto, PC board inspecting apparatuses for inspecting the quality of surface-mount soldering on printed circuit boards on which a number of electronic components are mounted have been proposed. In particular, as the throughput of information processors has improved in recent years, the number of apparatuses proposed for capturing an image of a PC board or a part of the PC board by an image capturing apparatus and conducting board inspection by an image process has been increasing.

One method for inspecting the deviation of IC component is a method of determining occurrence of a component deviation by detecting a color other than the color of the component body (for example, the color of the board) in an area in which a component body is to be disposed. The method is effective for square chips and transistors but has a technical drawback in inspection of an IC component. Since the area of the body of an IC component is much larger than that of square chips and transistors, if colors in all of the areas in which components are to be disposed are checked, process time increases and it becomes difficult to realize real-time board inspection. In addition, an image of the whole area in which component bodies are to be disposed has to be processed and recorded. Consequently, a large amount of memory or the storage capacity in the image storing apparatus required becomes very large. As a result, this increases the cost of the apparatus.

SUMMARY OF THE INVENTION

One embodiment of the present invention relates to a PC board inspecting method for detecting the deviation of an IC component mounted on a board by a board inspecting apparatus, including: a step of reading an inspection logic including a color condition for specifying a color appearing in body of a component to be inspected and a determination condition; a step of radiating the component to be inspected with a plurality of color rays at different angles of incidence; a step of capturing an inspection image which is formed by reflection light of the color rays and includes at least part of an edge of the body of the component to be inspected; a step of extracting a component body area satisfying the color condition from the inspection image by an image process using the color condition; a step of specifying an edge of the component body area by an image process; and a step of determining whether or not the component to be inspected is in a normal position by comparing the value of the characteristic amount of the edge with the determination condition.

Another embodiment relates to a PC board inspecting apparatus for detecting a deviation of an IC component mounted on a board, including: a storage medium that stores inspection logic including a color condition for specifying a color appearing in body of a component to be inspected and a determination condition; a light emitter that radiates the component to be inspected with a plurality of color rays at different angles of incidence; an imaging device that captures an inspection image which is formed by reflection light of the color rays and includes at least part of an edge of the body of the component to be inspected; an area extracting device that extracts a component body area satisfying the color condition from the inspection image by an image process using the color condition; an edge specifying device that specifies an edge of the component body area by an image process; and a determining device that determines whether the component to be inspected is in a normal position or not by comparing the value of the characteristic amount of the edge with the determination condition.

Another embodiment relates to a method of generating inspection logic for use in a PC board inspection. Specifically, an information processor by an image process specifies from a captured image a part of the component body and a part adjacent to the component body of an IC component mounted in a normal position, obtains frequency distributions of values of one or plural color characteristic amounts in a plurality of target points and exclusion points, the target points being pixels in the component body and the exclusion points being pixels in a part adjacent to the component body. Further, the information processor obtains a range of values of color characteristic amounts, that ideally separates the values of the characteristic amounts in the target points from the values of the characteristic amounts in the exclusion points on the basis of the frequency distributions of the values of the one or plural color characteristic amounts, and sets, as the color condition, the kind(s) of the one or plural color characteristic amounts and the range of values of the color characteristic amounts (hereinafter, the kinds of the color characteristic amounts and the range of values of the color characteristic amounts will be called "color range").

Yet another embodiment relates to an apparatus for generating a parameter for use in a PC board inspection, including: a device that specifies a part of the component body and a part adjacent to the component body by an image process from a captured image of an IC component mounted in a normal position; a device that obtains a frequency distribution of values of one or plural color characteristic amounts in a plurality of target points and a plurality of exclusion points, the target points being pixels in the component body and the exclusion points being pixels in the part adjacent to the component body; a device that obtains a range of values of the characteristic amounts that ideally separates the values of the characteristic amount(s) in the target points from the values of the characteristic amount(s) in the exclusion points on the basis of the frequency distribution(s) of the values of the one or plural color characteristic amount(s); and a device that sets, as the color condition, the kind(s) of the one or plural color characteristic amounts and the range (color range) of values of the color characteristic amounts.

Another embodiment relates to a PC board inspecting method of detecting a deviation of an IC component mounted on a board by a board inspecting apparatus. The method includes: a step of pre-storing an inspection logic including a color condition for specifying a color appearing in a base part of each of leads arranged at an edge of body of a component to be inspected, and a determination condition; a step of radiating the component to be inspected with a plurality of color rays at different angles of incidence; a step of capturing an inspection image formed by reflection light of the color rays; a step of extracting an inspection image including at least part of an edge of the body of the component to be inspected and a plurality of leads arranged at the edge; a step of extracting a plurality of lead areas satisfying the color condition from the inspection image by an image process using the color condition; a step of specifying a straight line connecting the plurality of lead areas by an image process;

and a step of determining whether the component to be inspected is in a normal position or not by comparing the values of the characteristic amounts of the straight line with the determination condition.

Another embodiment relates to a PC board inspecting apparatus for detecting a deviation of an IC component mounted on a board, including: a storage medium that stores an inspection logic including a color condition for specifying a color appearing in a base part of each of leads arranged at an edge of body of a component to be inspected, and a determination condition; a light emitter that radiates the component to be inspected with a plurality of color rays at different angles of incidence; an imaging device that captures an inspection image formed by reflection light of the color rays and including at least part of an edge of the body of the component to be inspected and a plurality of leads arranged at the edge; an area extracting device that extracts a plurality of lead areas satisfying the color condition from the inspection image by an image process using the color condition; a straight line specifying device that specifies a straight line connecting the plurality of lead areas by an image process; and a determining device that determines whether the component to be inspected is in a normal position or not by comparing the value of the characteristic amount of the straight line with the determination condition.

Further, another embodiment pertains to a method of generating a parameter for use in the above-described board inspecting apparatus.

Further another embodiment relates to an apparatus for generating a parameter for use in a board inspection.

DETAILED DESCRIPTION OF THE PREFERRED EMBODIMENTS

Preferred embodiments of the present invention will be described in detail herein below with reference to the drawings.

First Embodiment

Configuration of the Board Inspecting System

Figure 1:
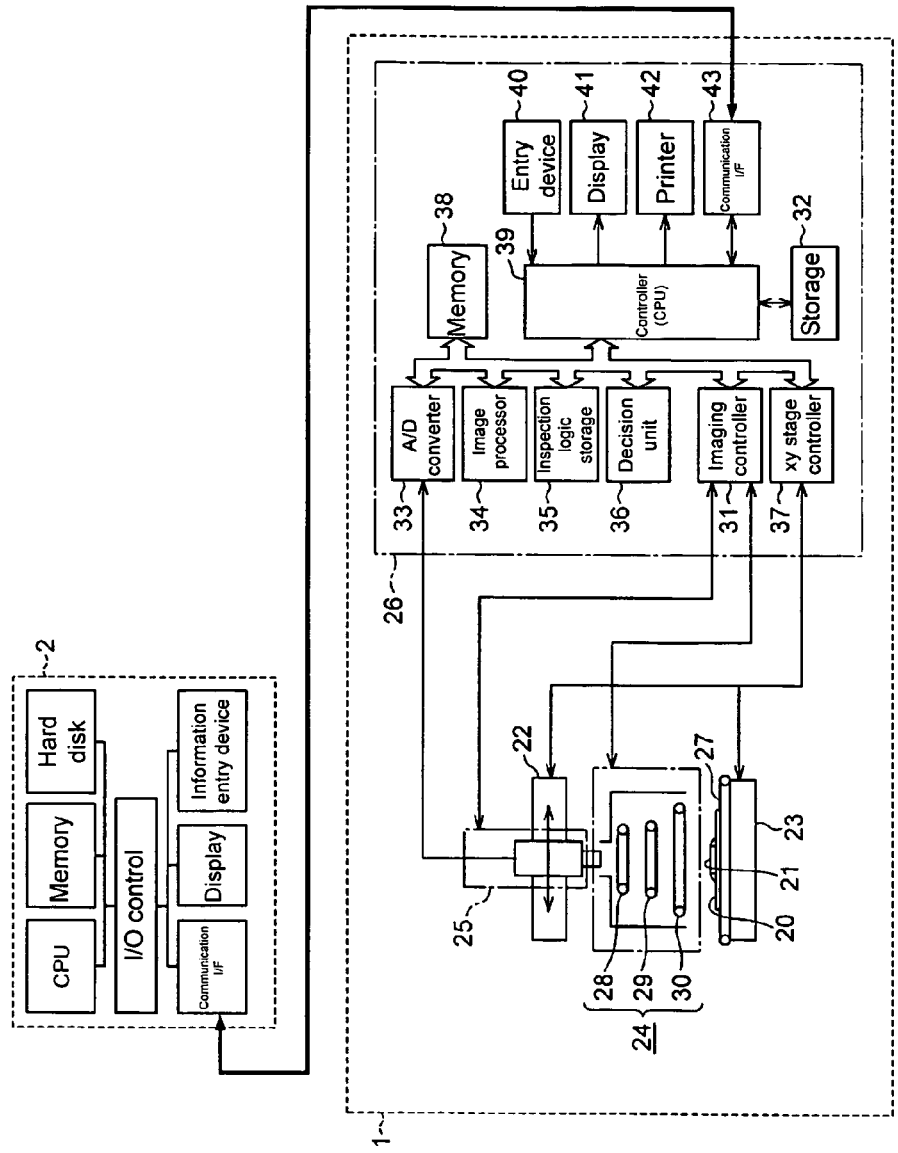
FIG. 1 shows a hardware configuration of a PC board inspection system according to one or more embodiments of the present invention.

FIG. 1 shows a hardware configuration of a PC board inspecting system according to a first embodiment of the invention.

The PC board inspecting system includes a PC board inspecting apparatus 1 for executing a board inspecting process and an inspection logic setting apparatus 2 for automatically generating an inspection logic for use in the board inspecting process of the PC board inspecting apparatus 1. The PC board inspecting apparatus 1 and the inspection logic setting apparatus 2 can transmit/receive electronic data such as an image and a parameter to/from each other via a wired or wireless network or a recording medium such as MO or DVD. Although the PC board inspecting apparatus 1 and the inspection logic setting apparatus 2 are constructed separately from each other in this embodiment, an integral configuration may be also employed by providing the body of the PC board inspecting apparatus with the functions of the inspection logic setting apparatus.

Configuration of PC Board Inspecting Apparatus

The PC board inspecting apparatus 1 is an apparatus for radiating a PC board with color rays, capturing an image formed by reflection light of the color rays, and automatically inspecting the mounting quality (such as soldering state) of a surface mounted component 21 on a board 20 by using the captured image. The PC board inspecting apparatus 1 comprises, for example, an X stage 22, a Y stage 23, a light emitter 24, an imaging device 25, and a control processor 26.

Each of the X stage 22 and the Y stage 23 has a motor (not shown) which operates on the basis of a control signal from the control processor 26. By the driving of the motors, the X stage 22 moves the light emitter 24 and the imaging device 25 in the X axis direction, and the Y stage 23 moves a conveyer 27 supporting the board 20 in the Y axis direction.

The light emitter 24 is constructed by three annular light sources 28, 29, and 30 having different diameters and simultaneously emit red light, green light, and blue light on the basis of control signals from the control processor 26. The light sources 28, 29, and 30 are disposed so that their center is adjusted to a position directly above an observation position, in directions corresponding to their angles of elevation which are different from each other when seen from the observation point. By the arrangement, the light emitter 24 emits a plurality of color rays (of the three colors of R, G, and B in this embodiment) which are incident on the surface-mounted component 21 on the board 20 at different angles of incidence.

The imaging device 25 is a color camera and is positioned so as to face downward in the position directly above the observation position. Reflection light from the board surface is captured by the imaging device 25 and is converted to the color signals R, G, and B of the three primary colors. The color signals R, G, and B are supplied to the control processor 26.

The control processor 26 includes an A/D converter 33, an image processor 34, an inspection logic storage 35, a decision unit 36, an imaging controller 31, an XY stage controller 37, a memory 38, a controller (CPU) 39, a storage 32, an entry device 40, a display 41, a printer 42, and a communication I/F 43.

The A/D converter 33 is a circuit for receiving the color signals R, G, and B from the imaging device 25 and converting them to digital signals. Gradation image data of a digital amount of each hue is transferred to an image data storing area in the memory 38.

The imaging controller 31 is a circuit including an interface connecting the controller 39 and the light emitter 24 and the imaging device 25. The imaging controller 31 adjusts the light amount of each of the light sources 28, 29, and 30 of the light emitter 24 on the basis of an output of the controller 39 and controls to maintain mutual balance among light outputs of different hues of the imaging device 25.

The XY stage controller 37 is a circuit including an interface of the controller 39 and the X and Y stages 22 and 23, and controls driving of the X and Y stages 22 and 23 on the basis of an output of the controller 39.

The inspection logic storage 35 is a storage medium for storing an inspection logic used for the board inspecting process. The PC board inspecting apparatus 1 can perform a plurality of kinds of inspecting processes such as a fillet inspection for inspecting the shape of solder and a deviation inspection for detecting deviation of a component. An inspection logic is prepared for each kind of inspection and includes an area condition for specifying a range to be inspected (inspection area) in an image, a color condition for extracting a predetermined color pattern (pixel area) from an image in the inspection area, and a determination condition for determining based on the color pattern whether or not the component to be inspected is acceptable. The area condition is a condition of specifying the position, size, range etc. of an inspection area in an image, for example, "range of 20 pixels from an edge position of the body of a component in a normal position in directions orthogonal to the edge and 80 pixels in the direction along the edge". The color condition is a condition of specifying a color characteristic amount to be noted (in this example, brightness and intensity of a red signal) and a range of values of the color characteristic amount like, for example, "the brightness of a pixel lies in the range of 128 to 207 and the intensity of a red signal lies in the range of 192 to 255". The determination condition is a condition that specifies a characteristic amount to be noted (in this example, the angle of the edge) and the range of values of the characteristic amount (in this example, the upper limit value) like, for example, "the angle of the detected edge is five degrees or less".

The imaging processor 34 is a circuit for executing a process of extracting an inspection area specified by the area condition from the captured image of the component 21 on the board 20, a process of extracting an area satisfying the color conditions from an image of the inspection area (inspection image), and a process of calculating a value of the characteristic amount used for the determination condition from the extracted area. The decision unit 36 is a circuit that receives the value of the characteristic amount calculated by the image processor 34 and executes a process of determining whether the component is mounted in a good state or not on the basis of whether the value of the characteristic amount satisfies the determination condition or not.

The entry device may includes a keyboard and a mouse necessary to enter operation information, data about the board 20 or the component 21, etc. The entered data is supplied to the controller 39. The communication I/F 43 is used to transmit/receive data among the inspection logic setting apparatus 2 and other external devices.

The controller (CPU) 39 is a circuit for executing various computing processes and control processes. The storage 32 can be a hard disk, a memory, etc. and stores not only programs executed in the controller 39 but also CAD data of the board, results of determination of board inspecting processes, etc.

Figure 2:
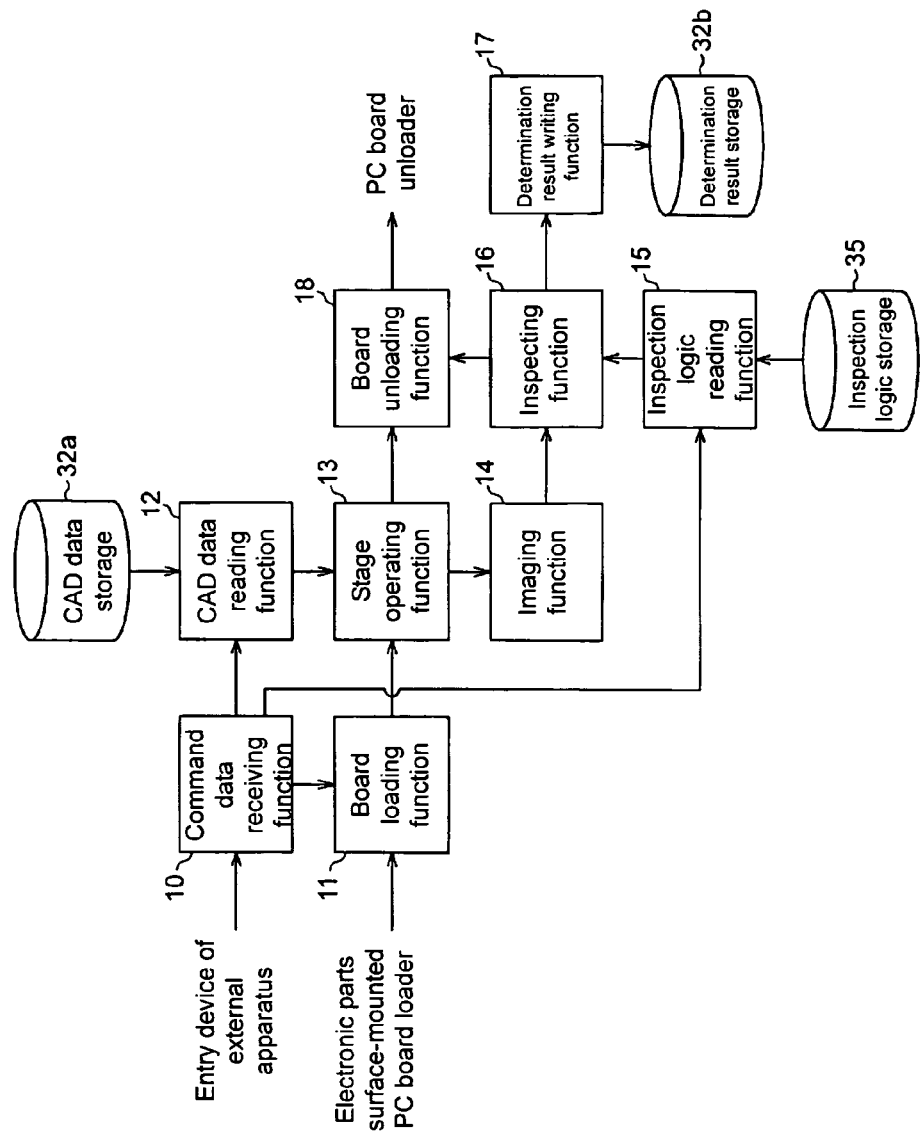
FIG. 2 shows an example of a functional configuration of a PC board inspecting apparatus according to one or more embodiments of the present invention.

FIG. 2 shows a functional configuration of the PC board inspecting apparatus 1. The PC board inspecting apparatus 1 has a command data receiving function 10, a board loading function 11, a CAD data reading function 12, a stage operating function 13, an imaging function 14, an inspection logic reading function 15, an inspecting function 16, a determination result writing function 17, and a board unloading function 18. Those functions are realized when the controller 39 controls the hardware in accordance with a program stored in the storage 32. The storage 32 has therein a CAD data storage 32a for storing CAD data and a determination result storage 32b for storing a determination result.

Board Inspecting Process

Next, the board inspecting process in the PC board inspecting apparatus 1 will be described. In this embodiment, a method of detecting a deviation of an IC component by paying attention to the position and angle of an edge of the component body will be described.

Figure 3:
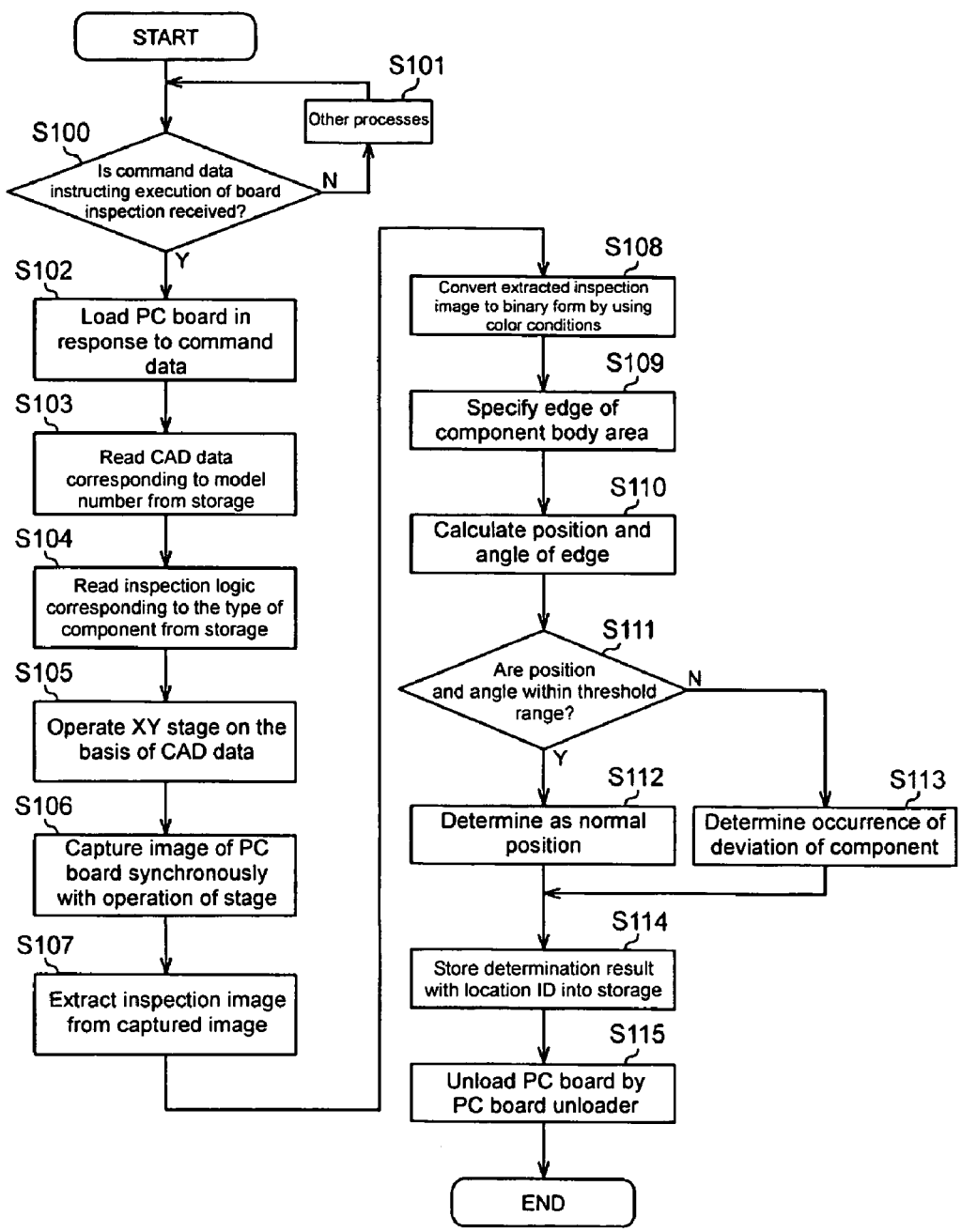
FIG. 3 shows a flowchart illustrating the flow of PC board inspecting process of a first embodiment.

FIG. 3 shows a flowchart illustrating the flow of the inspecting process.

The command data receiving function 10 is in a standby state until command data that instructs execution of a board inspection is entered (NO in step S100 and step S101). When command data is entered from an external device by the operation of the entry device 40 or via the communication I/F 43, the command data receiving function 10 sends the command data to the board loading function 11, CAD data reading function 12, and inspection logic reading function 15 (YES in step S100). The command data includes information (such as model number) of a board to be inspected.

The board loading function 11 loads the board 20 to be inspected from a PC board loading part onto the conveyer 27 on the basis of the command data (step S102). The CAD data reading function 12 reads CAD data corresponding to the model number of the board from the CAD data storage 32a (step S103). The CAD data includes the dimensions and shape of the board 20 and also data of the kinds and quantities of components mounted on the board 20 and data of mounting positions.

The inspection logic reading function 15 reads from the inspection logic storage 35 an inspection logic for detecting a deviation of an IC part in accordance with the kind of the component obtained from the CAD data (step S104). The inspection logic includes the area condition, color condition, and determination condition.

Next, the stage operating function 13 obtains data such as the dimensions and shape of the board 20 and the layout of the parts from the read CAD data and operates the X stage 22 and the Y stage 23 via the XY stage controller 37 so that a plurality of components 21 mounted on the board 20 are positioned in observation positions (image pickup positions) (step S105).

On the other hand, the imaging function 14 makes the three light sources 28, 29, and 30 of the light emitter 24 emit light via the imaging controller 31 to simultaneously radiate the board 20 with light of red, green, and blue. The imaging function 14 controls the imaging device 25 via the imaging controller 31 and captures an image of the parts 21 on the board 20 synchronously with the operations of the stages 22 and 23 (step S106). The captured image is stored in the memory 38.

Figure 4:
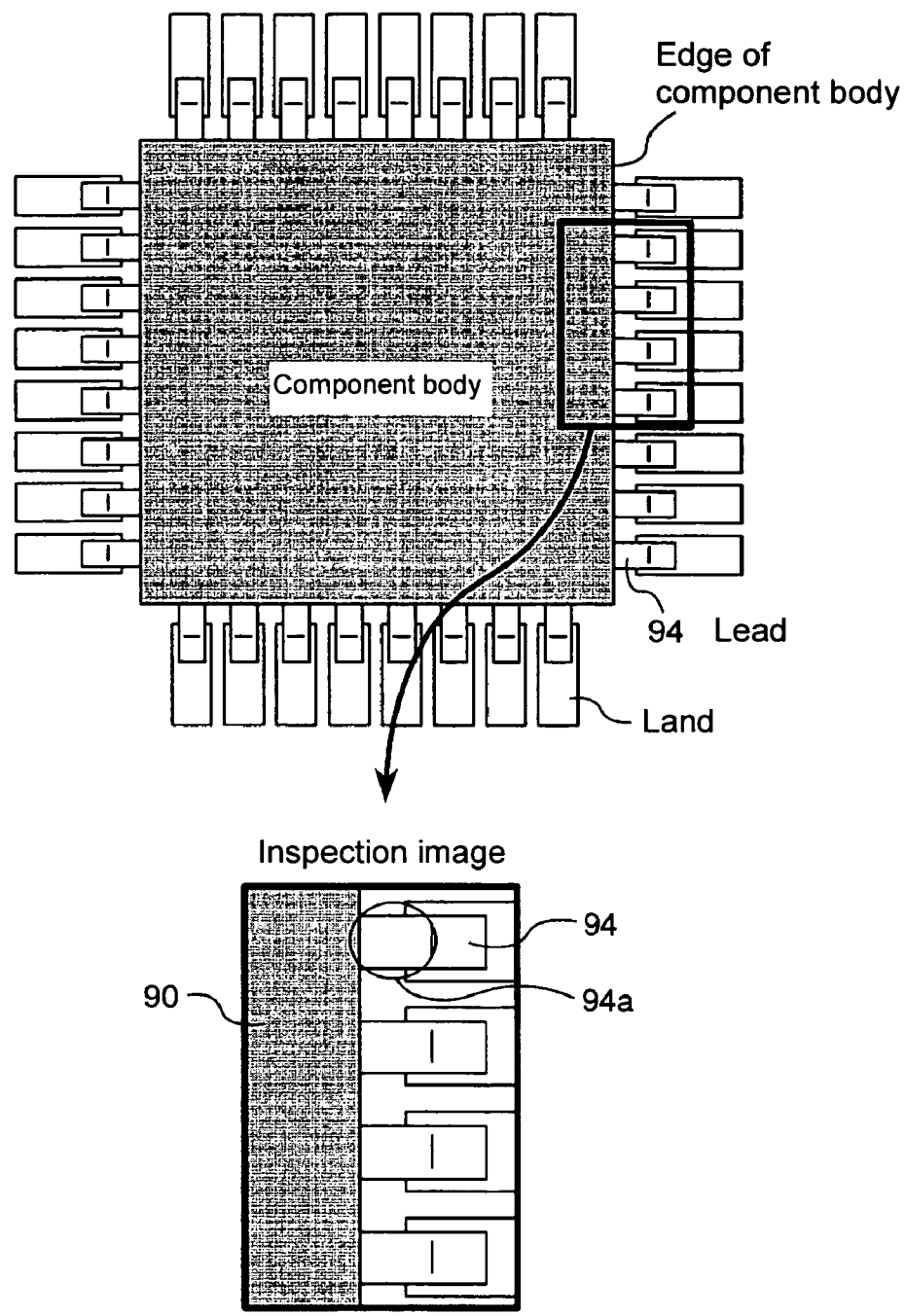
FIG. 4 shows a range of an inspection image for use in inspection according to one or more embodiments of the present invention.

Next, the inspecting function 16 extracts an inspection image from the captured image by the image processor 34 (step S107). The inspection image is an area specified by the area condition of the inspection logic. In this embodiment, as shown in FIG. 4, the inspection image is extracted so that at least part of an edge of a component body 90 is included. Specifically, since the component body 90 has an almost rectangular shape, it has four edges. It is sufficient that one of the edges be included in the inspection image. The whole edge does not have to be included in the inspection image. It is sufficient that part of the edge be included.

Subsequently, the inspecting function 16 converts the inspection image into a binary form by using the color condition by the image processor 34 (step S108). The color condition used here specifies the range of colors appearing in the component body. In other words, the color condition distinguishes (separates) colors appearing in the component body from colors appearing in the part adjacent to the component body. The color appearing in the component body depends on the material, surface shape, color, surface roughness etc. of the component body. For example, in the case where the component body is a resin package, light is irregularly reflected by the surface of the component body. Although inherently, the component appears reddish-black, a color similar to when white light is emitted appears in the resulting image. When mirror reflection occurs on the surface of the component body, any of three colors of red, green, and blue appears in an image. Obviously, the colors appearing in the part adjacent to the component body appears in a similar manner. Therefore, according to the tendencies of colors appearing in the component body and the part adjacent to the component body, the kinds (hue, brightness etc.) of the color characteristic amounts used for the color condition are selected. The color condition of this embodiment is constructed by four values of the upper and lower limits of the intensity of a red signal and the upper and lower limits of brightness. This is because the component to be inspected in this embodiment is a resin package and red-based colors having low brightness appear in the component body in the capturing image. It is assumed here that each of the intensity of a red signal and brightness has a value in 256 levels of 0 to 255. In the binarizing process, a pixel included in the color range defined by the color condition (pixel satisfying the color condition) is converted to a white pixel, and the other pixels are converted to black pixels.

Figure 5:
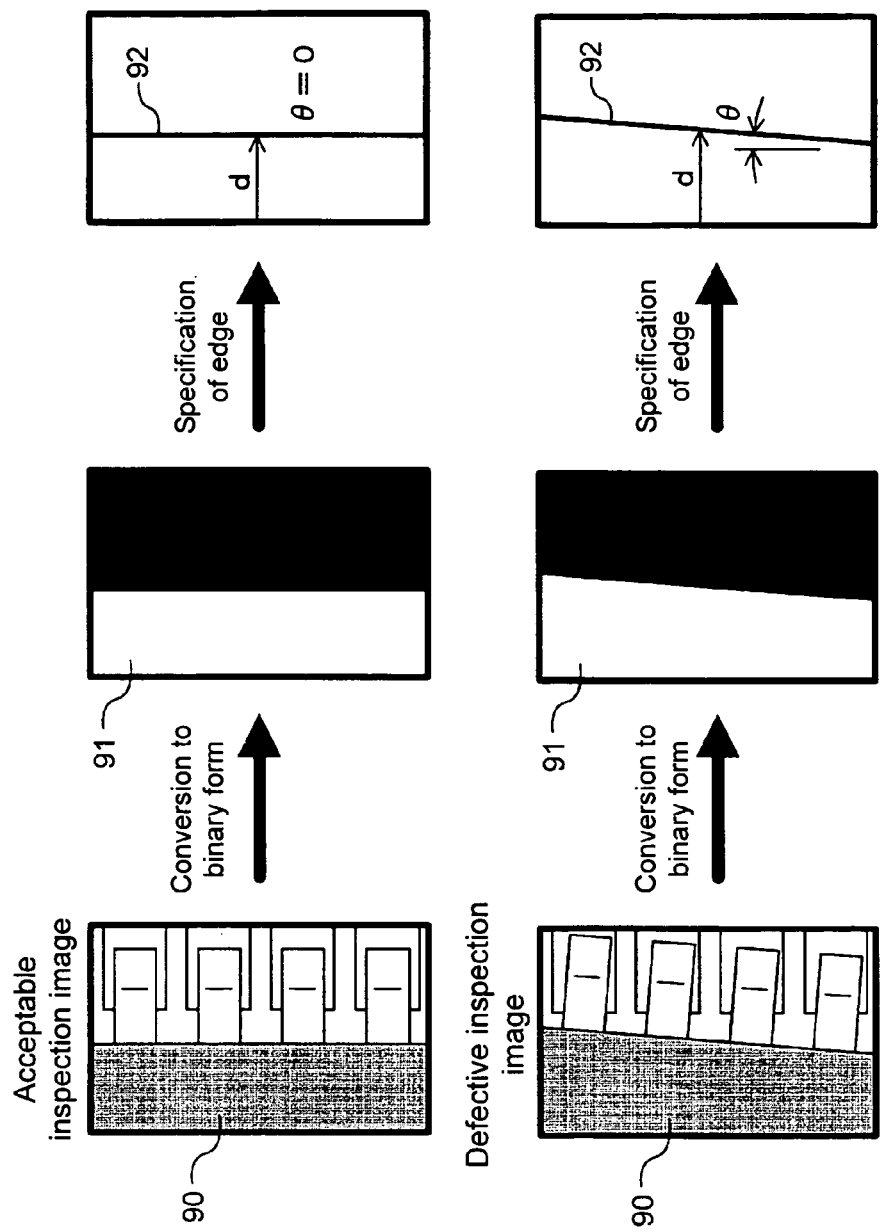
FIG. 5 shows a binarizing process and an edge specifying process performed on an inspection image of the first embodiment.

FIG. 5 shows inspection images of an acceptable component (component which is mounted in a normal position) and a defective component (component which is deviated) and results of the inspection images converted into binary forms. It is understood that by converting the images into the binary form with the color condition, the part of the component body 90 in an inspection image is extracted as a white pixel area. The extracted area will be called a component body area 91.

Subsequently, the inspecting function 16 specifies an edge 92 of the component body area 91 by the image processor 34 (step S109). An existing image processing method such as Hough transform may be used for specifying an edge. The edge 92 specified can be regarded as an edge of the component body 90.

Further, the inspecting function 16 calculates the position and angle of the edge 92 as the characteristic amounts of the edge 92 (step S10). In the example of FIG. 5, distance "d" from the middle point of a side at the left end of the inspection image to the edge 92 along the direction perpendicular to the side is obtained. As the angle of the edge 92, the absolute value of the angle of the inspection image from the perpendicular direction is obtained. The calculation result is passed to the decision unit 36.

The decision unit 36 compares the calculated position and angle of the edge 92 with the inspection logic determination conditions (step S111). The determination conditions specify the range in which the position is regarded as normal (state where no deviation of the component occurs) and are constructed by, for example, allowable limit values (an upper limit value and/or a lower limit value) of the deviation amount of the position and angle of the edge. In the case where the position and angle of the edge 92 lie in the range of the determination conditions (YES in step S111), it is determined that the component is mounted in a normal position (acceptable component) (step S112). In the case where the position or angle of the edge 92 is out of the determination condition range (NO in step S111), it is determined that deviation occurs in the component (defective component) (step S113).

The determination result writing function 17 writes the determination result together with location ID (that is data for specifying the component) into the determination result storage 32b (step S114).

After completion of inspections on all of components on the board 20, the board unloading function 18 unloads the board 20 by a PC board conveyer, and the board inspecting process is finished (step S115).

In the above-described board inspecting process, it is sufficient to extract the component body area satisfying the color condition from the inspection image and compare the position and angle of the edge in the area with the determination conditions. Consequently, deviation of an IC component can be easily detected at high speed and with high precision. Moreover, it is unnecessary to deal with the image of the whole component. It is sufficient to process the image (inspection image) of a part of the component, so that the amount of memory and/or image storage capacity used can also be reduced.

Although both of the position and angle of an edge are used for the determining process in this embodiment, the determination can be also made with only one of the characteristic amounts. Although attention is paid to only one edge in this embodiment, by performing similar determining process on a plurality of edges, determination precision and reliability of an inspection can be improved.

As described above, in this embodiment during inspection, a color condition expressing a color of an area to be noted is preset, an area satisfying the color condition is extracted from an inspection image, and whether the component is good or not is determined based on various characteristic amounts (such as area and length) of the extracted area. It is therefore necessary to set prior to actual inspection, a color condition for use in inspection and a determination condition for separating an acceptable component from a defective component.

To realize high determination precision with which a defective component is not overlooked and is equal to or less than an allowable value, it is important to set a color condition so that a significant and clear difference appears between a characteristic amount of an acceptable component and a characteristic amount of a defective component. In particular, to realize detection of a deviation, it is necessary to have a color condition that can (accurately) distinguish a color appearing in the component body from a color appearing in the part adjacent to the component body. In this embodiment, generation (teaching) of inspection logic is automatically performed by the inspection logic setting apparatus 2. It will be described in detail below.

Configuration of Inspection Logic Setting Apparatus

As shown in FIG. 1, the inspection logic setting apparatus 2 is a general computer (information processor) including, as basic hardware, a CPU, memory, a hard disk, an I/O control unit, a communication I/F, a display, and information entry devices (keyboard and mouse).

Figure 6:
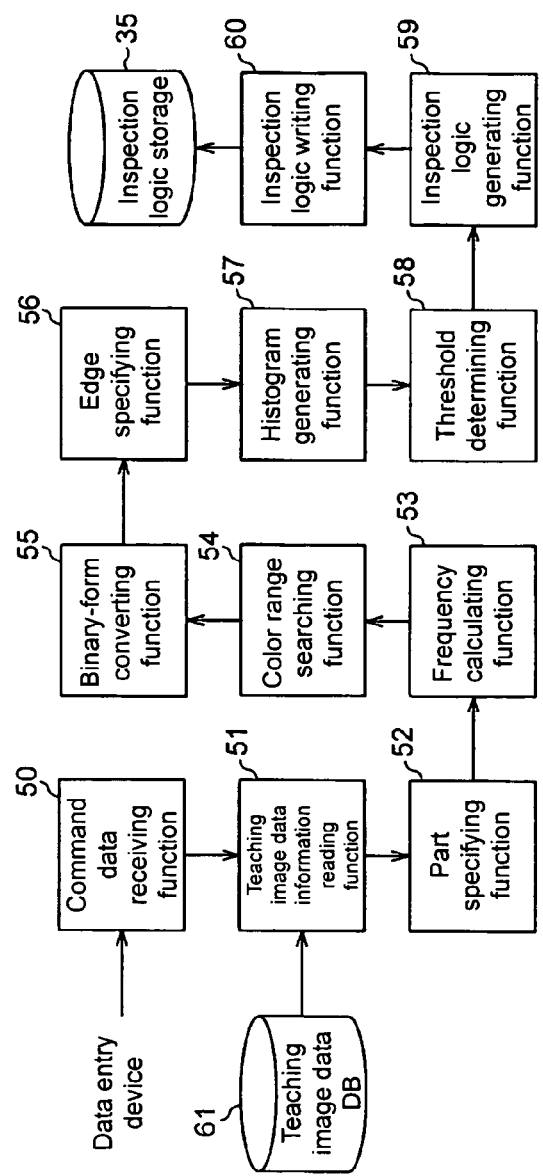
FIG. 6 shows a functional configuration of an inspection logic setting apparatus of the first embodiment.

FIG. 6 shows a functional configuration of the inspection logic setting apparatus 2 according to the first embodiment. The inspection logic setting apparatus 2 has a command data receiving function 50, a teaching image data reading function 51, a part specifying function 52, a frequency calculating function 53, a color range searching function 54, a binarizing function 55, an edge specifying function 56, a histogram generating function 57, a threshold calculating function 58, an inspection logic generating function 59, and an inspection logic writing function 60. The functions are realized when a program stored in memory or on a hard disk is loaded onto the CPU and executed.

On the hard disk, a teaching image data DB 61 for storing teaching image data used for teaching is provided. The teaching image data is constructed by an image of the IC component captured by the board inspecting apparatus 1 and teaching data indicating that the component in the image is acceptable (the component is mounted in a normal position) or not (the component is deviated). To increase the reliability of teaching, it is preferable to prepare tens to thousand of pieces of teaching image data for each of acceptable and defective components.

Inspection Logic Setting Process

Figure 7:
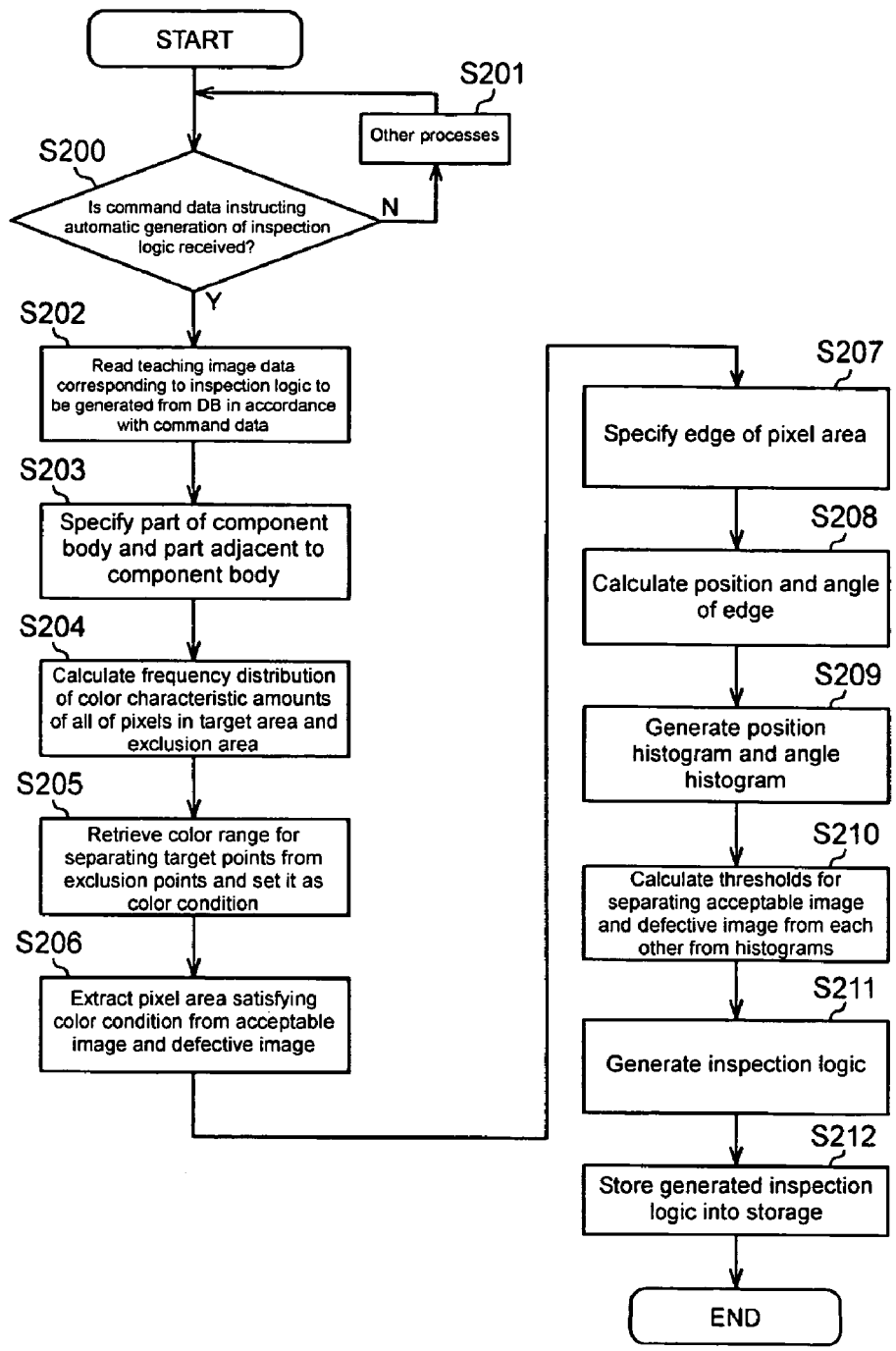
FIG. 7 shows a flowchart illustrating the flow of inspection logic setting process of the first embodiment.

The flow of the inspecting logic setting process will be described with the flowchart of FIG. 7.

The command data receiving function 50 is in a standby state until command data that instructs automatic generation of inspection logic is entered (NO in step S200, step S201). When the command data is entered from the command entry device, the command data receiving function 50 transmits the command data to the teaching image data reading function 51 (YES in step S200). The command data includes data that specifies teaching image data as an object of generation of the inspection logic, data indicative of the type or model number of a component to be inspected, and data of the kinds of defects to be detected.

The teaching image data reading function 51 reads teaching image data corresponding to inspection logic to be generated from the teaching image data DB 61 in accordance with the command data (step S202). The teaching image data includes a plurality of acceptable images and a plurality of defective images. The images are provided with the teaching data.

(1) Color Condition Setting Process

Figure 8:
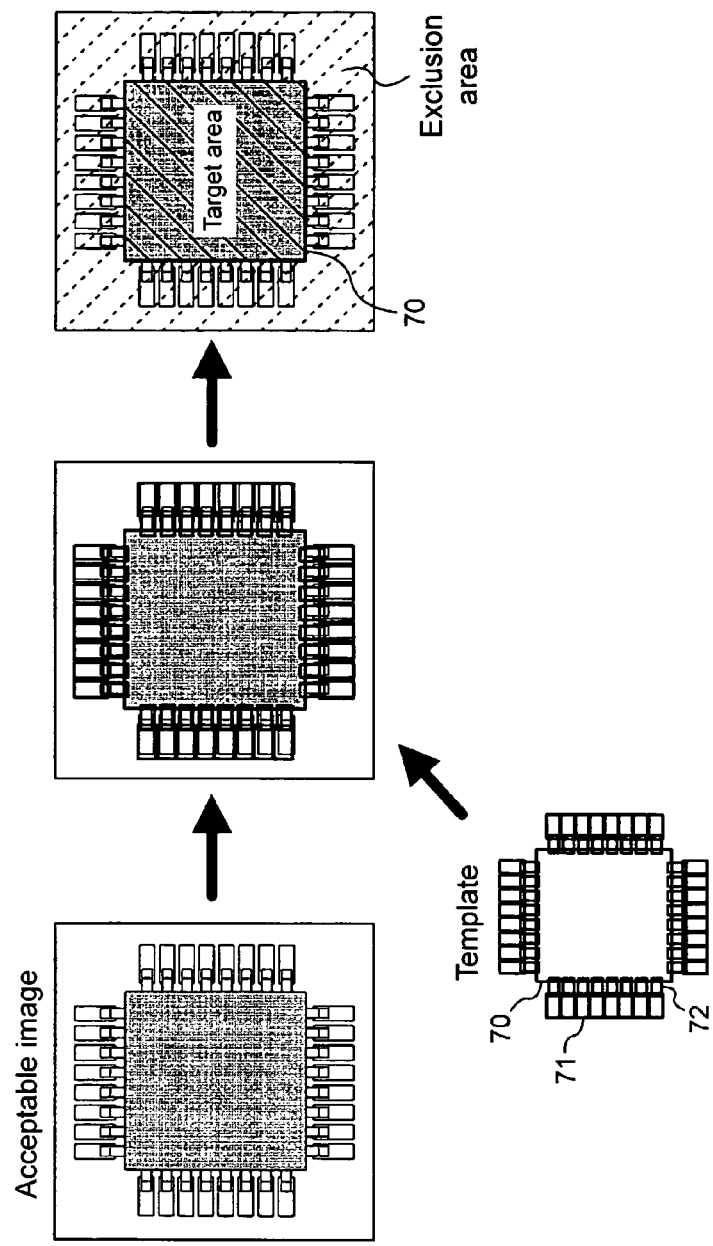
FIG. 8 shows a process of specifying a component body part according to one or more embodiments of the present invention.

First, color conditions are set by using only images of acceptable components. The part specifying function 52 specifies "the part of the component body" (hereafter, called "target area") and "the part adjacent to the component body" (hereafter, called "exclusion area") in an image of acceptable component by the image process (step S203). Specifically, the part specifying function 52 has a template constructed by a component body window 70, a land window 71, and a lead window 72 as shown in FIG. 8. While enlarging/reducing the template and shifting the relative positions of the windows, the part specifying function 52 adjusts the windows to the component body, a land, and a lead in the image. For adjustment of the windows, for example, a method such as template matching may be used. Subsequently, the part specifying function 52 sets the inside of the component body window 70 to the target area (the solid-line hatched part) and sets the outside of the component body window 70 to the exclusion area (the broken-line hatched part). Since only the acceptable images are used, the target area and the exclusion area can be specified with high precision.

As described above, in an actual deviation inspection process, only a part of the component body is extracted by using the color condition. Generation of the color conditions optimum to the process is equivalent to seeking an optimal solution for a color range that as much as possible includes colors of pixels of the target area and excludes most of the colors of the pixels in the exclusion area.

First, the frequency calculating function 53 obtains the frequency distribution of colors of the color characteristic amounts of all of the pixels in the target area and the exclusion area (step S204). In this operation, the pixels in the target area are used as "target points", the pixels in the exclusion area are used as "exclusion points", and the frequency calculation is executed in a form that the target points and the exclusion points can be distinguished from each other. For instance, to visualize the frequency distribution, a color histogram is used. The color histogram is obtained by recording the frequency (the number) of pixels in each of points in a multidimensional space using the color characteristic amounts from one of the set of color spaces as axes. By the color histogram, color distributions of the pixels in the target area and the exclusion area can be grasped. The pixel denotes here the minimum resolution of an image. When a process of mapping a plurality of pixels is executed, colors are mixed. It is therefore preferable to perform the process pixel by pixel.

Generally, the color space is a multidimensional space constructed by three or more color characteristic amounts. Therefore, to accurately grasp the color distribution of pixels, it is desirable to calculate the frequencies on at least two color characteristic amounts. However, since the components included in an image to be inspected and colors of the components are limited, if the purpose is to determine a color condition for distinguishing the color (target point) of the component body from the color (exclusion point) of the peripheral area, it is sufficient to consider the color characteristic amount of one or two colors with respect to hues. In this embodiment, red is selected as a hue that is mostly included in the component body and is hardly included in the part adjacent to the component body. The frequency is calculated for each combination of brightness and intensity of red.

Figure 9:
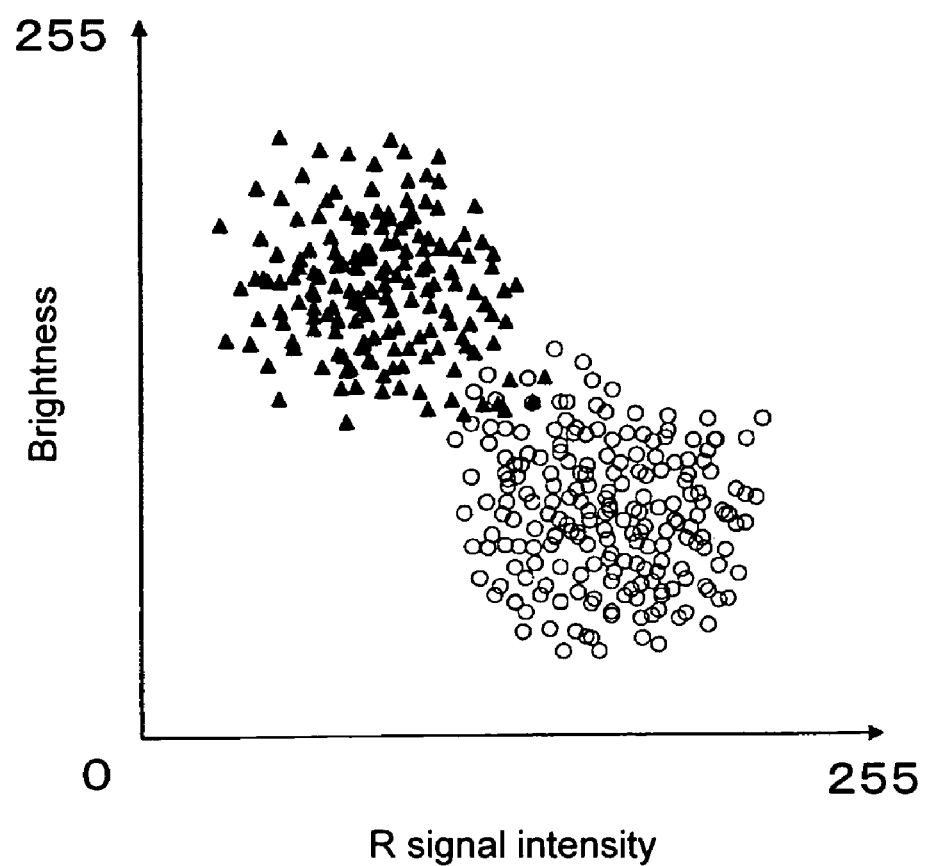
FIG. 9 shows an example of a two-dimensional color histogram according to one or more embodiments of the present invention.

FIG. 9 shows an example of a two-dimensional color histogram. The horizontal axis of FIG. 9 indicates the intensity of red, and the vertical axis indicates the value of brightness. Each of the intensity and brightness is expressed in numerical values of 256 levels from 0 to 255. A blank circle in the diagram shows a point where the frequency of a pixel in the target area is 1 or higher. A painted triangle shows a point where the frequency of a pixel in the exclusion area is 1 or higher. Each of the blank circles and painted triangles has frequency data (the number of pixels having the color) in addition to the intensity of red and brightness. Also in FIG. 10, which will be described later, like FIG. 9, each of blank circles and painted triangles expresses a pixel and also holds three-dimensional data (of intensity of red, brightness, and frequency).

Figure 10A:
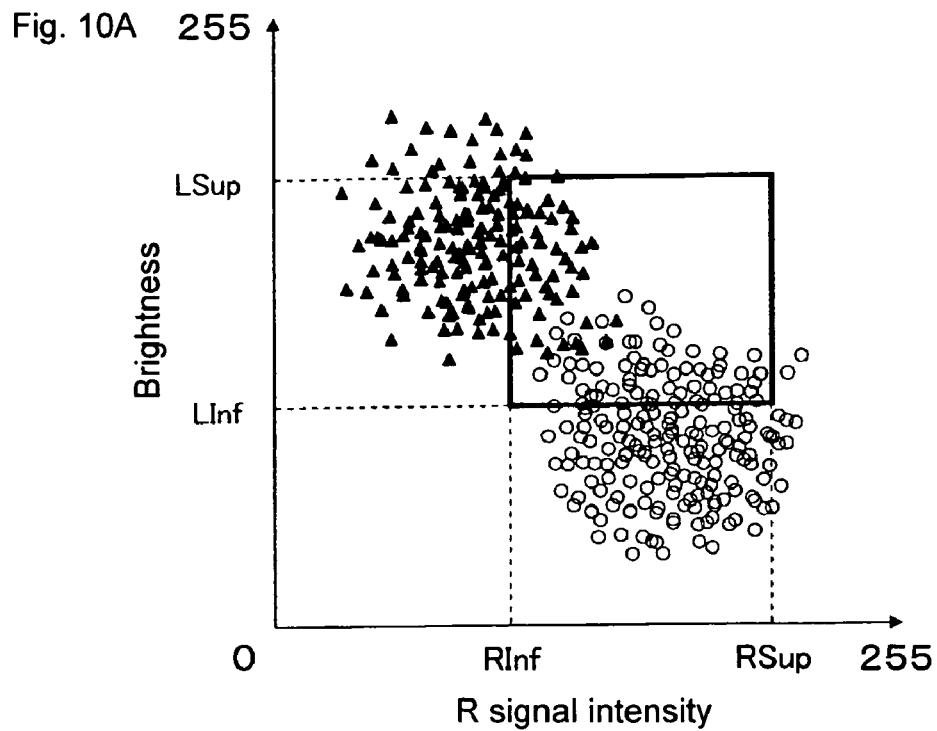
FIGS. 10A and 10B show a color range searching process according to one or more embodiments of the present invention.

Next, the color range searching function 54 searches for a color range which optimally separates the color distribution of target points and the color distribution of exclusion points from each other on the basis of the frequency distributions of the target points and the exclusion points (step S205). In this embodiment, to simplify the algorithm, as shown in FIG. 10A, four values of the upper limit (RSup) and the lower limit (RInf) of intensity and the upper limit (LSup) and the lower limit (LInf) of brightness are obtained. The optimum solution to be obtained is combination (RInf, RSup, LInf, and LSup) of the four values constructing the color range which as much as includes target points (blank circles) and hardly includes the exclusion points (painted triangles).

Figure 10B:
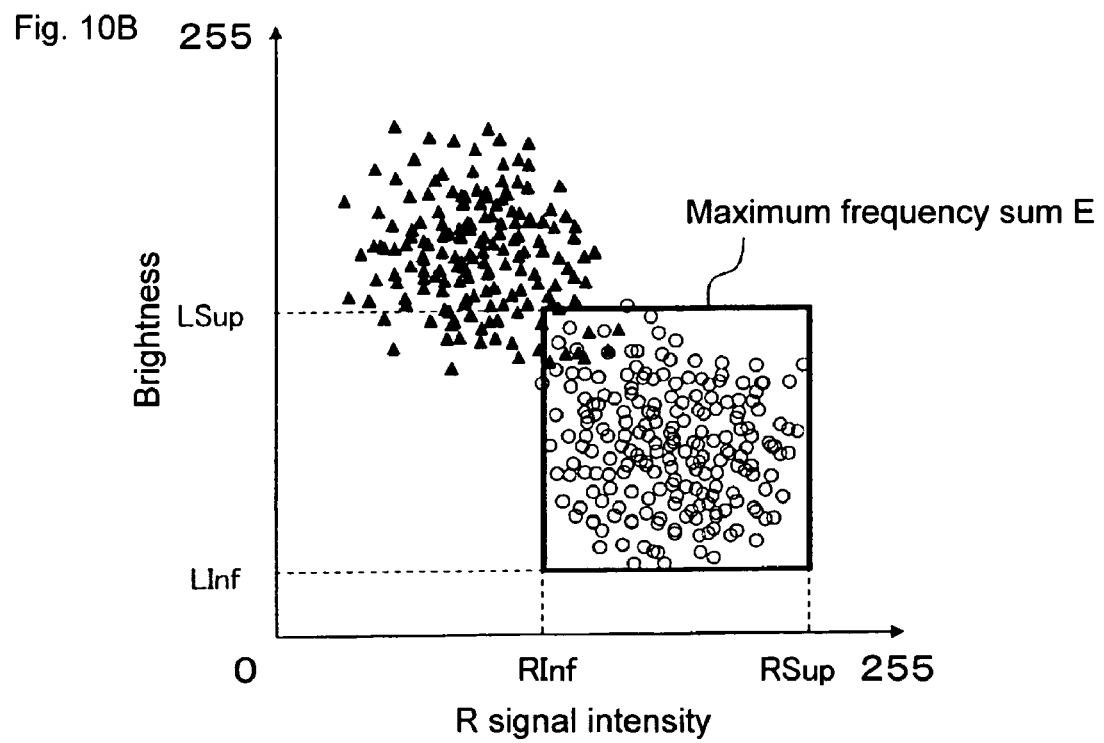

Specifically, the color range searching function 54 calculates a frequency sum E of the color range while changing each of the values RInf, RSup, LInf, and LSup (see Equation 1) and obtains the color range in which the frequency sum E is the maximum. The frequency sum E indicates an index showing the difference between the number (frequency) of target points included in the color range and the number (frequency) of exclusion points. FIG. 10B shows the color range in which the frequency sum E is the maximum.

[Expression 1]

$$E = \sum_{r=RInf}^{RSup} \sum_{l=LInf}^{LSup} \{S(r, l) - R(r, l)\} \quad \text{Equation 1}$$

r: intensity of red
l: brightness
S(r,l): frequency of target point at point (r,l)
R(r,l): frequency of exclusion point at point (r,l)

The color range searching function 54 sets the color range in which the frequency sum E is the maximum as a color condition for inspection. As described above, according to this embodiment, generation of the color characteristic amounts for separating the part (target points) of the component body and the part (exclusion points) adjacent to the component body from each other and combination of the values, and setting the generated combination as the color condition can be performed automatically.

Although the color condition is constructed by four color parameters of the upper and lower limit values of brightness and the upper and lower limit values of intensity of red in this embodiment, parameters of other color characteristic amounts may be also employed. As the color characteristic amounts, for example, intensity, brightness, saturation, and hue of blue, red, green, cyan, magenta, yellow etc., spectral tristimulus values X, Y and Z in CIEXYZ, L*, a*, and b* in CIELAB, and L*, u(u'), and v(v') in CIELUV can be used. The number of color characteristic amounts constructing the color condition is not limited to two. The number may be one or three or more. That is, color parameters employed for a color condition can be properly selected in accordance with the tendencies of color patterns of the component body in a captured image and a peripheral area of the component body. The color parameters do not have to be predetermined. It is also preferable to prepare a plurality of color characteristic amount candidates constructed by one or a plurality of color characteristic amounts, perform the above-described frequency distribution calculating process and color condition calculating process on each of the color characteristic amount candidates, and employ the optimum color characteristic amount as a color condition. In this case, it is sufficient to determine a color characteristic amount candidate by obtaining the degree of separation between the target point and the exclusion point (in this embodiment, the maximum frequency sum E corresponds to the degree of separation) and comparing the degrees of separation. For example, one color characteristic amount candidate having the maximum degree of separation may be selected or a plurality of color characteristic candidates may be selected in order from the higher degree of separation. As the method of searching for the color range, in addition to the above-described methods, known methods such as discriminant analysis and SVM (Support Vector Machine) can be used.

(2) Determination Condition Setting Process

Next, a process of automatically generating a determination condition for detecting a deviation by using the color condition and acceptable and defective images is executed.

First, the binarizing function 55 converts each of the acceptable image and the defective image into an image in the binary form by using the color condition to extract a pixel area satisfying the color condition (step S206). Subsequently, the edge specifying function 56 specifies the edge of a white pixel area (step S207) and, after that, calculates the characteristic amounts (the position "d" and the angle) of the edge (step S208). The processes are similar to those described with reference to FIG. 5.

Figure 11A:
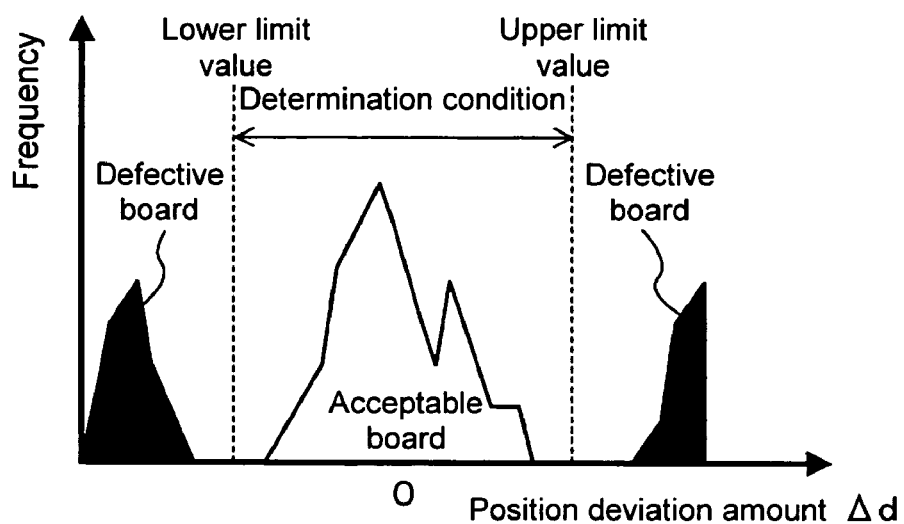
FIGS. 11A and 11B show an example of a histogram according to one or more embodiments of the present invention.
Figure 11B:
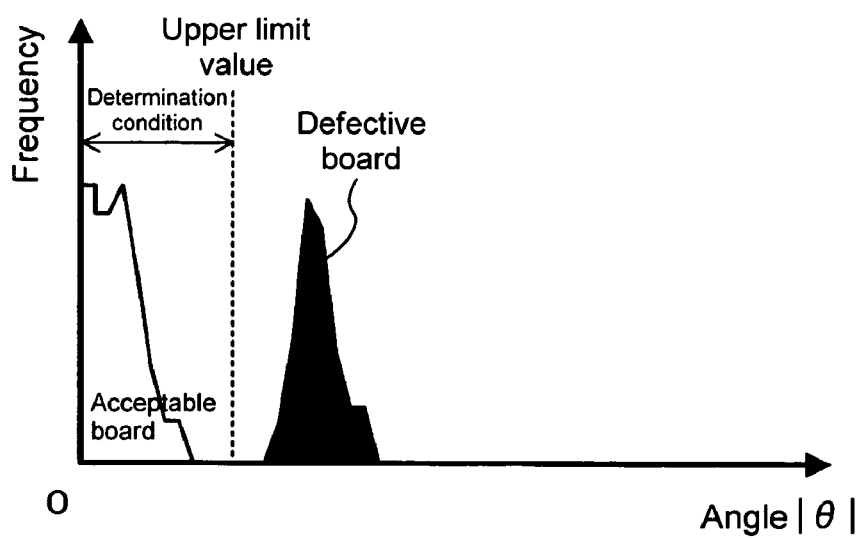

The histogram generating function 57 obtains the frequency distribution of values of the characteristic amounts of the edge in order to grasp the difference between the distribution tendency of the values of the characteristic amounts of the edge in the acceptable image and that of the values of the characteristic amounts in the defective image (step S209). In this embodiment, the position and angle are employed as the characteristic amounts of the edge, and the frequency distribution is obtained for each of the characteristic amounts. To visualize the frequency distributions of the position and angle of the edge, a position histogram related to the position of the edge and an angle histogram related to the angle of the edge are used here. FIG. 11A shows an example of the position histogram, and FIG. 11B shows an example of the angle histogram. The horizontal axis of FIG. 11A shows a position deviation amount d, and the horizontal axis of FIG. 11B shows the absolute value of the angle of the edge. The position deviation amount d is the difference between the position "d" of the edge calculated in step S208 and a position (normal position) d0 in which the edge is to appear (d=d d0). The normal position d0 can be calculated from CAD data. It is understood from FIGS. 11A and 11B that there is a clear difference between the characteristic amount distribution (white) of the acceptable image and the characteristic amount distribution (black) of the defective image.

The threshold calculating function 58 calculates a threshold that ideally separates the values of the characteristic amounts of the edge in the acceptable image from the values of the characteristic amounts of the edge in the defective image on the basis of the frequency distribution of the histograms (step S210). In this embodiment, three thresholds of the upper and lower limit values of the position "d" of the edge and the upper limit value of the angle of the edge are calculated. Various methods for optimally separating a plurality of mountains appearing in a histogram have been proposed and any of them may be employed. For example, the Otsu's discriminant analysis may be used. Alternately, a point apart from the end of a mountain of the acceptable image only by 3 may be determined as a threshold on the basis of experience, or a threshold may be set between the end point of the mountain of the acceptable image and the end point of the mountain of the defective image. In such a manner, the determination condition for distinguishing the acceptable image and the defective image from each other is generated.

After that, the inspection logic generating function 59 generates an inspection logic from the color condition and the determination condition (step S211). The inspection logic writing function 60 writes the inspection logic into the inspection logic storage 35 in the board inspecting apparatus 1 and, after that, the inspection logic setting process is finished (step S212).

In this embodiment, inspection logic for detecting a deviation of an IC component at high speed with small storage volume is automatically generated, so that time and load required for teaching can be largely reduced.

Moreover, the optimum color condition and the determination condition are calculated by the above-described algorithm so that deviation of the IC component can be detected with high precision. The reliability of the color condition and the determination condition improves as the number of pieces of teaching image data to be given first increases.

Second Embodiment

In the first embodiment, a deviation of an IC component is detected by examining edge characteristics of a part of a component body. However, there is a case it is difficult to specify an edge due to variations and color irregularity in the color distribution of the part of the component body. For example, in the case where characters, symbols etc. are printed on the surface of the component body, the color irregularity of the part of the component body can occur when the surface of the component body is deformed by heating at the time of reflow. In the second embodiment, therefore, paying attention to the point that a number of leads are linearly disposed along an edge in an IC component, a deviation of a component is detected by inspecting the position and angle of a straight line connecting a plurality of leads (hereafter, called "lead line").

Board Inspecting Process

Figure 12:
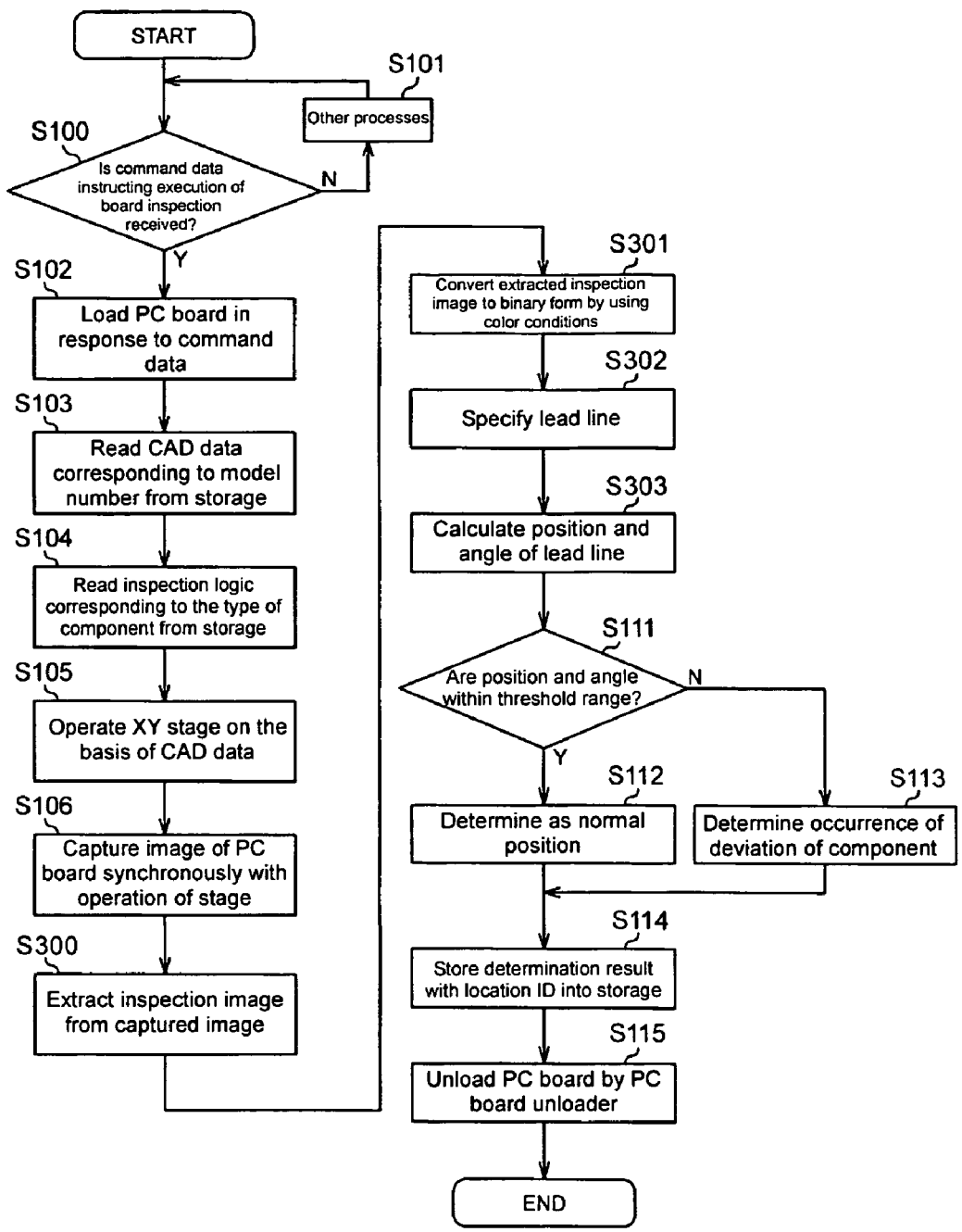
FIG. 12 shows a flowchart illustrating the flow of a PC board inspecting process of a second embodiment.

First, with reference to the flowchart of FIG. 12, the flow of the inspecting process of the second embodiment will be described. The same step numbers are given to processes similar to those in the first embodiment (see FIG. 3) and their detailed description will not be repeated.

According to command data, a board to be inspected is loaded and CAD data is read (steps S100 to S103). Depending on the kind of a component obtained from the CAD data, inspection logic for detecting a deviation of an IC component is read (step S104). The inspection logic includes an area condition, a color condition, and a determination condition. On the basis of the CAD data, the loaded board is properly positioned and an image of the component is captured (steps S105 and S106).

Next, the inspecting function 16 extracts an inspection image from the captured image by the image processor 34 (step S300). The inspection image is of an area specified by the area condition of the inspection logic. In this embodiment, as shown in FIG. 4, an inspection image is extracted so that part of an edge of the body 90 of the component to be inspected and a plurality of leads 94 arranged at the edge are included. If there are at least two leads 94, straight line detection which will be described later can be performed. However, to increase the reliability of the process, it is preferable that three or more leads 94 be included in the inspection image. The whole lead 94 does not have to be included in the inspection image. It is sufficient that at least a base part (shoulder part) 94a is included.

Subsequently, the inspecting function 16 converts the inspection image into a binary form by using the color condition by the image processor 34 (step S301). The color condition used here specifies the range of colors appearing in the base part of the lead. In other words, the color condition distinguishes (separates) a color appearing in the base part of the lead and a color appearing in a part adjacent to the base part of the lead from each other. The color condition of this embodiment is constructed by four values of the upper and lower limits of the intensity of a red signal and the upper and lower limits of brightness for the reason that red colors having high brightness appear in the base part of a lead in a captured image. In the binarizing process, a pixel included in the color range defined by the color condition (pixel satisfying the color condition) is converted to a white pixel, and the other pixels are converted to black pixels.

Figure 13:
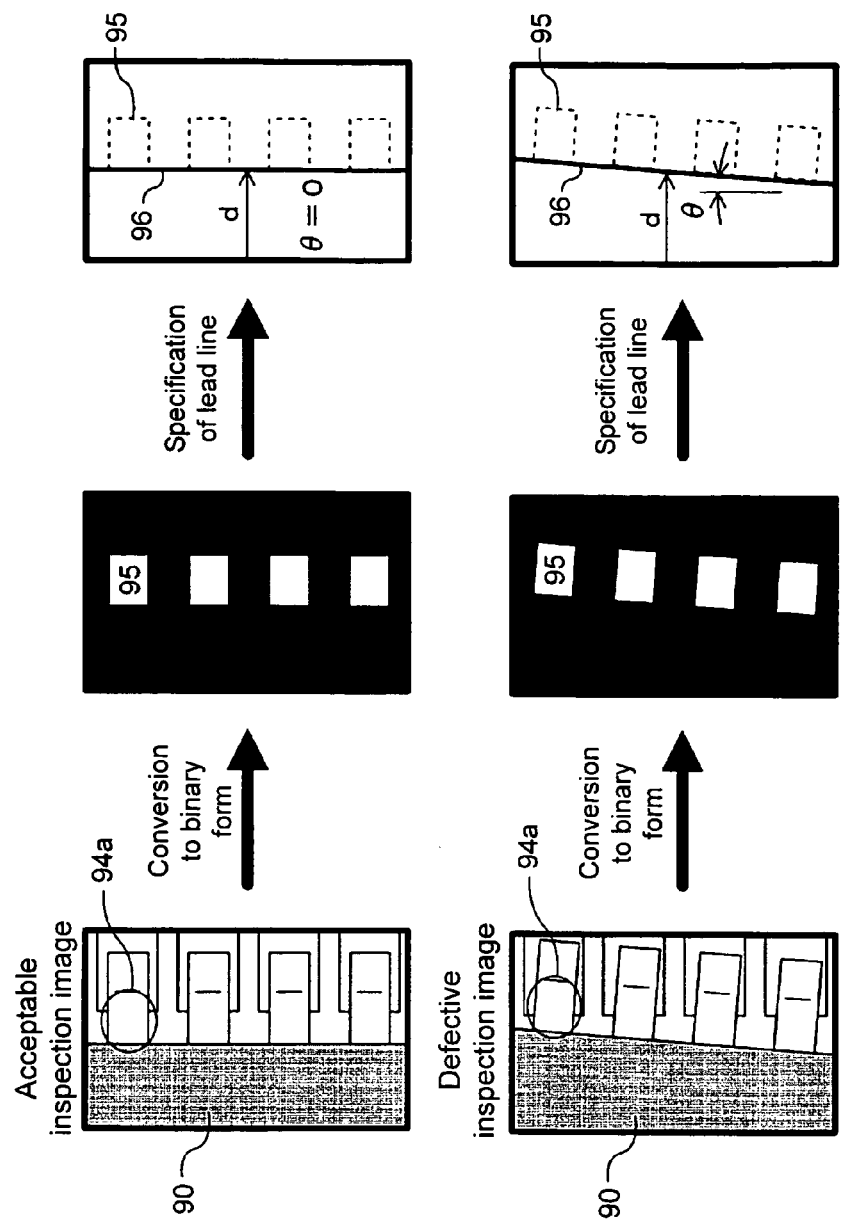
FIG. 13 shows a binarizing process and an edge specifying process performed on an inspection image in the second embodiment.

FIG. 13 shows inspection images of an acceptable component (which is mounted in normal position) and a defective component (which is deviated) and results of conversion of the components to binary forms. It is understood that, by converting the component into a binary form with the color condition, the base part 94a of a lead in the inspection image is extracted as a white pixel area. The extracted area is called a lead area 95.

Subsequently, the inspecting function 16 specifies a straight line (lead line) 96 connecting the plurality of lead areas 95 by the image processor 34 (step S302). To specify a straight line, an existing image processing method such as Hough transform or a straight line detecting method such as least square method may be used.

The lead line 96 specified here can be regarded as a straight line parallel to the edge of the component body 90. Therefore, in a manner similar to the first embodiment, the position "d" and the angle of the lead line 96 are calculated (step S303) and compared with the determination condition of the inspection logic, thereby determining whether the position of the component is normal or not (steps S111 to S113). The determination result of each of IC components mounted on the board is written with the location ID into the determination storage 32b (step S114), and the board inspecting process is finished (step S115).

In the board inspecting process, it is sufficient to extract a plurality of lead areas satisfying the color condition from an inspection image and compare the position and angle of a straight line connecting the areas with the determination condition. Thus, a deviation of an IC component can be easily detected at high speed and with high precision. Moreover, it is unnecessary to deal with an image of the whole component but it is sufficient to process an image (inspection image) of part of the component, so that the amount of memory and/or image storage capacity used can also be reduced. Since attention is paid to red having high brightness which appears in the base part of a lead in this embodiment, even an IC component having variations and unevenness in the color of the component body can be inspected without a problem.

Although both the position and angle of a lead line are used for the determining process in the second embodiment, determination can be also made by using only one of the characteristic amounts. Although attention is paid to only the lead line of one edge in this embodiment, by similarly executing the determining process on lead lines of a plurality of edges, the determination precision and the reliability of inspection can be improved.

Inspection Logic Setting Process

Figure 14:
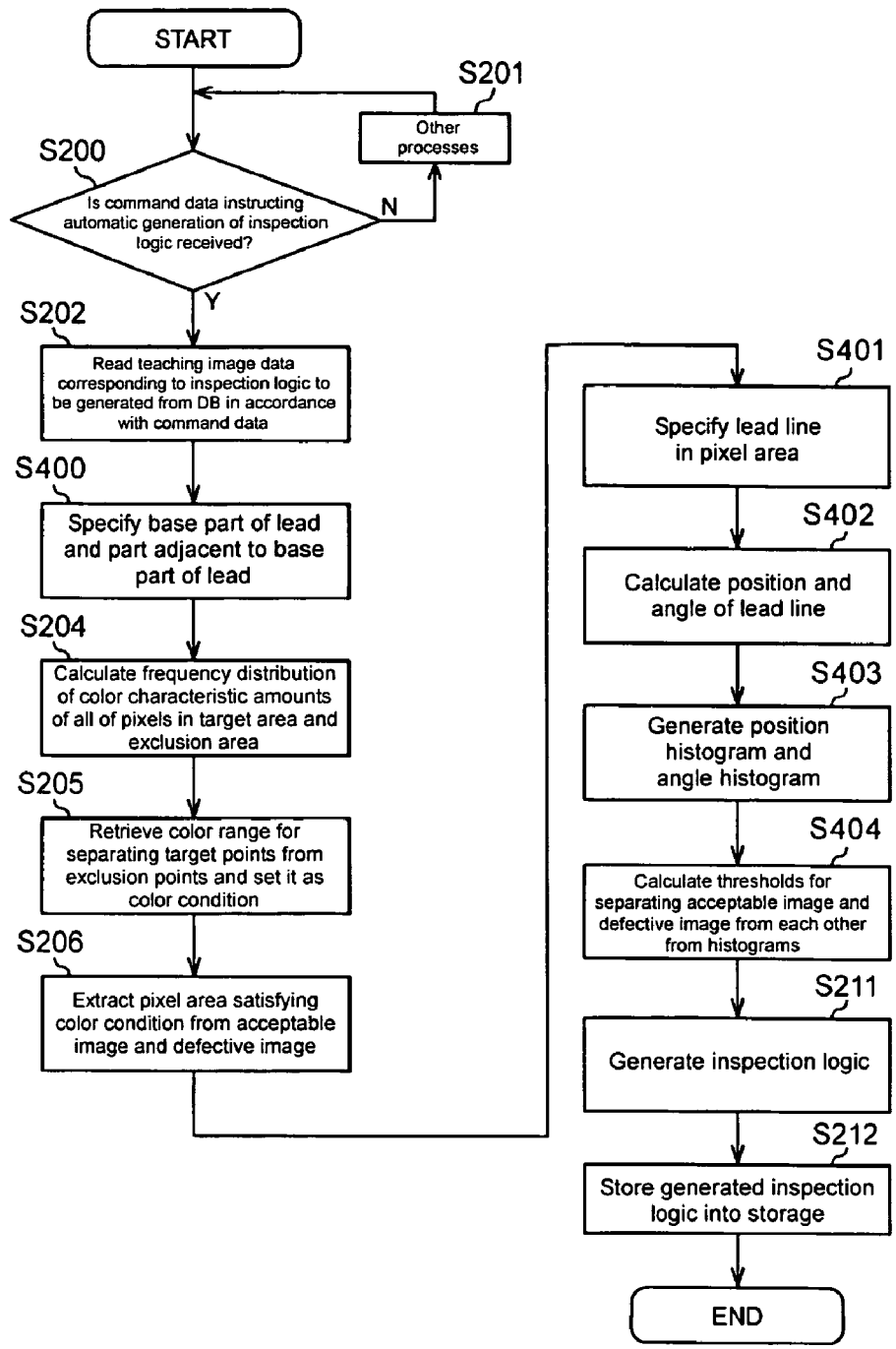
FIG. 14 shows a flowchart illustrating the flow of an inspection logic setting process in the second embodiment.

With reference to the flowchart of FIG. 14, the flow of the inspection logic setting process of the second embodiment will be described. The same step numbers are given to processes similar to those in the first embodiment (see FIG. 7) and their detailed description will not be repeated. The functional configuration of the inspection logic setting apparatus is similar to that in the first embodiment (FIG. 6) except for a "straight line specifying function" is provided in place of the edge specifying function 56.

Depending on command data which is entered, teaching image data is read from the teaching image data DB 61 (steps S200 to S202). The teaching image data includes a plurality of images of an acceptable component and a plurality of images of a defective component. The images are associated with teaching data.

(1) Color Condition Setting Process

Figure 15:
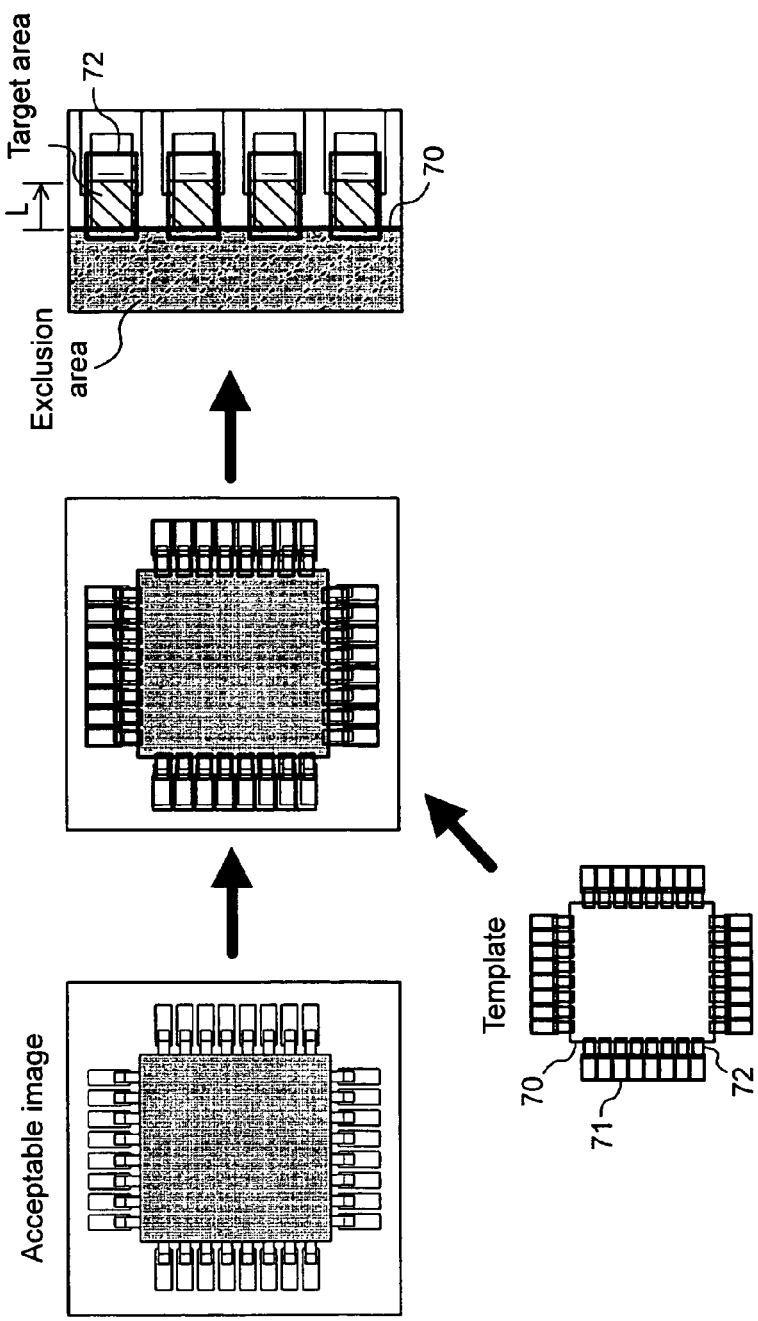
FIG. 15 shows an example of a process of specifying a base part of a lead according to one or more embodiments of the present invention.

First, the color conditions are set only with images of acceptable components. The part specifying function 52 specifies the "base part of a lead" (hereinbelow, called "target area") and a "part adjacent to the base part of a lead" (hereinbelow, called "exclusion area") from the images of acceptable components (step S400). Specifically, as shown in FIG. 15, the part specifying function 52 has a template constructed by the component body window 70, the land window 71, and the lead window 72. While enlarging/reducing the template and shifting the relative positions of the windows, the part specifying function 52 adjusts the windows to the part body, a land, and a lead in the image. For adjustment of the windows, for example, a method such as template matching may be used. Subsequently, the part specifying function 52 sets a predetermined range in the lead window 72 (for example, a range of distance L from the border between the lead window 72 and the component body window 70) as a target area (part hatched with solid lines), and sets the inside of the component body window 70 as an exclusion area (part hatched with broken lines). Since only the images of acceptable components are used, the target area and the exclusion area can be specified with high precision.

In the deviation inspection process of the second embodiment, only the base part of a lead is extracted by using the color condition. Generation of the color conditions optimum to the process is equivalent to seeking an optimal solution for a color range that as much as possible includes colors of pixels of the target area and excludes most of the colors of the pixels in the exclusion area.

Consequently, in a manner similar to the first embodiment, the frequency distributions of colors of the color characteristic amount of all of the pixels in the target area and the exclusion area are obtained (step S204) and searches for color range that separates the color distribution of target points and the color distribution of exclusion points from each other (step S205). In such a manner, the color condition for extracting a shoulder part of a lead is automatically generated.

(2) Determination Condition Setting Process

Next, the process of automatically generating a determination condition for detecting a deviation by using the color conditions and images of acceptable and defective components is described.

First, the binarizing function 55 converts each of the images of acceptable and defective images into a binary form and extracts a pixel area satisfying the color condition (step S206). Subsequently, the straight line specifying function specifies a lead line in each of the images (step S401) and, after that, calculates the characteristic amounts (position and angle) of the lead line (step S402). The processes are similar to those described with reference to FIG. 13.

Subsequently, the histogram generating function 57 obtains the frequency distribution of values of the characteristic amounts of a lead line in order to grasp the difference between the distribution tendency of values of the characteristic amounts of a lead line in an image of an acceptable component and the distribution tendency of values of the characteristic amounts in an image of a defective component (step S403). In this embodiment, position and angle are employed as the characteristic amounts of the lead line and the frequency distribution of each of the characteristic amounts is obtained. To visualize the frequency distributions of the positions and angles of lead lines, a position histogram related to the position of a lead line and an angle histogram related to the angle of a lead line are used. In a manner similar to the first embodiment, the threshold calculating function 58 calculates a determination condition that ideally separates the values of the characteristic amounts of a lead in an acceptable image from the values of the characteristic amounts of a lead in a defective image on the basis of the frequency distribution of the histograms (step S404).

After that, the inspection logic generating function 59 generates an inspection logic from the color condition and the determination condition (step S211). The inspection logic writing function 60 writes the inspection logic into the inspection logic storage 35 in the board inspecting apparatus 1 and, after that, the inspection logic setting process is finished (step S212).

In this embodiment, an inspection logic used for detecting a deviation of an IC component at high speed with small storage volume is automatically generated, so that time and load required for teaching can be largely reduced.

Moreover, the optimum color condition and the optimum determination condition are calculated by the above-described algorithm, so that a deviation of an IC component can be detected with high precision. The reliability of the color condition and the determination condition improves as the number of pieces of teaching image data to be given first increases.

Modifications

The foregoing embodiments show only concrete examples of the present invention. The scope of the present invention is not limited to the foregoing embodiments but the invention can be variously modified within the scope of technical ideas of the invention.

In terms of color condition, in the foregoing embodiments, two color characteristic amounts are used as parameters, and the color range is specified by the maximum and minimum values of the color characteristic amounts and is a range having a rectangle shape on a two-dimensional plane. The color range determining method is not limited to the above. The color range may have a circular shape, a polygonal shape, a free-curve shape etc. on a two-dimensional plane. Further, also in the case of using three or more parameters, similarly, the maximum and minimum values are obtained for each of the parameters, and the combination of the maximum and minimum values may be used. A color range may be expressed by combination of two or more parameters (for example, a range indicative of a spherical shape in a three-dimensional space). As the method of searching for the color range, in addition to the methods described in this embodiment, known methods such as discriminant analysis and SVM (Support Vector Machine) can be used.

Although both the position and angle of a lead line are used as characteristic amounts of an edge or a lead line in the foregoing embodiments, only one of the characteristic amounts may be used or characteristic amounts other than the position and angle can be also used.

As described at the beginning of the first embodiment, the inspecting apparatus and the inspection logic setting apparatus can be constructed separately from each other or can be of integral configuration. Further, the function of PC board inspection of the inspecting apparatus and the function of generating inspection logic of the inspection logic setting apparatus can relatively be constituted as a computer program, and the programs and/or the inspection logic can be provided via a wired or wireless network or from a recording medium such as FD, CD, MO, DVD, USB memory, etc. Obviously, a recording medium that stores the programs and stores the inspection logic is within the scope of the present invention.

What is claimed is:

1. A method of setting an inspection logic for inspecting a PC board, the inspection logic including a color condition for specifying a color appearing in body of a component to be inspected and a determination condition, the method comprising:

a step of specifying a part of the component body and a part adjacent to the component body by an image process from a captured image of an IC component mounted in a normal position;

a step of obtaining frequency distributions of values of one or plural color characteristic amounts in a plurality of target points and exclusion points, the target points being pixels in the component body and the exclusion points being pixels in a part adjacent to the component body;

a step of obtaining a range of values of color characteristic amounts, that ideally separates the values of the characteristic amounts in the target points from the values of the characteristic amounts in the exclusion points on the basis of the frequency distributions of the values of the one or plural color characteristic amounts;

a step of setting, as the color condition, the kind(s) of the one or plural color characteristic amounts and the range of values of the color characteristic amounts;

a step of extracting a pixel area satisfying the color condition from each of a plurality of images of an acceptable IC component mounted in a normal position and a plurality of images of a defective IC component which is deviated;

a step of specifying an edge of each pixel area by an image process;

a step of obtaining a frequency distribution of values of the characteristic amount of the edge;

a step of obtaining a range of values of characteristic amounts which ideally separate values of characteristic amounts of an edge of a pixel area extracted from the image of the acceptable IC component from values of characteristic amounts of an edge of a pixel area extracted from the image of the defective IC component on the basis of the frequency distribution of values of the characteristic amounts; and a step of setting, as the determination condition, the kind of the characteristic amount and the range of values of the characteristic amount.

2. The inspection logic setting method according to claim 1, wherein the kind of the color characteristic amount is preliminarily determined.

3. The inspection logic setting method according to claim 1, further comprising: a step of generating a plurality of color characteristic amount candidates constructed by one or a plurality of color characteristic amounts;

a step of obtaining a range of values of color characteristic amounts that separate ideally the value of the color characteristic amount in the target point from the value of the color characteristic amount in the exclusion point and the degree of separation with respect to each of the plurality of color characteristic amount candidates;

a step of selecting a color characteristic amount candidate employed as the color condition by comparing the degrees of separation; and a step of setting, as the color condition, the kind(s) of one or plural color characteristic amounts constructing the selected color characteristic amount candidate, and the range of values of the color characteristic amounts.

4. An inspection logic setting method according to claim 1, wherein the kind of the characteristic amount is at least one of position and angle of the edge.

5. An apparatus for generating an inspection logic for inspecting a PC board, comprising:

a device that specifies a part of the component body and a part adjacent to the component body by an image process from a captured image of an IC component mounted in a normal position;

a device that obtains a frequency distribution of values of one or plural color characteristic amounts in a plurality of target points and a plurality of exclusion points, the target points being pixels in the component body and the exclusion points being pixels in the part adjacent to the component body;

a device that obtains a range of values of the characteristic amount that ideally separates the values of the characteristic amount(s) in the target points from the values of the characteristic amount(s) in the exclusion points on the basis of the frequency distribution(s) of the values of the one or plural color characteristic amount(s);

a device that sets, as the color condition, the kind(s) of the one or plural color characteristic amounts and the range of values of the color characteristic amounts;

a device that extracts a pixel area satisfying the color condition from each of a plurality of images of an acceptable IC component mounted in a normal position and a plurality of images of a defective IC component which is deviated;

a device that specifies an edge of each pixel area by an image process;

a device that obtains a frequency distribution of values of the characteristic amounts of the edge;

a device that obtains a range of values of characteristic amounts which ideally separate values of characteristic amounts of an edge of a pixel area extracted from the image of the acceptable IC component from values of characteristic amounts of an edge of a pixel area extracted from the image of the defective component on the basis of the frequency distribution of values of the characteristic amounts; and a device that sets, as the determination condition, the kind of the characteristic amount and the range of values of the characteristic amount.

6. The inspection logic setting apparatus according to claim 5, wherein the kind of the color characteristic amount is preliminarily determined.

7. The inspection logic setting apparatus according to claim 5, further comprising a device that obtains a plurality of color characteristic amount candidates constructed by one or plural color characteristic amounts, wherein the device that obtains a frequency distribution of values of the color characteristic amount obtains frequency distributions of the color characteristic amounts in the target points and the exclusion points with respect to each of the plurality of color characteristic amount candidates obtained by the device that obtains a plurality of color characteristic amount candidates, the device that obtains the range of values of color characteristic amounts obtains a range of values of color characteristic amounts, that separates ideally the values of the color characteristic amounts in the target points from the values of the color characteristic amounts in the exclusion points and the degree of separation with respect to each of the plurality of color characteristic amount candidates, and obtains the degree of separation, and the setting device selects a color characteristic amount candidate employed as the color condition by comparing the degrees of separation and sets, as the color condition, the kind(s) of one or plural color characteristic amounts constructing the selected color characteristic amount candidate, and the range of values of the color characteristic amounts.

8. The inspection logic setting apparatus according to claim 5, wherein the kind of the characteristic amount is at least one of position and angle of the edge.

9. A program stored on a tangible computer readable medium for generating an inspection logic for inspecting a PC board, and making an information processor execute processes the processes comprising:

a process of specifying a part of the component body and a part adjacent to the component body by an image process from a captured image of an IC component mounted in a normal position;

a process of obtaining frequency distributions of values of one or plural color characteristic amounts in a plurality of target points and a plurality of exclusion points, the target points being pixels in the component body and the exclusion points being pixels in the part adjacent to the component body;

a process of obtaining a range of values of the color characteristic amounts that ideally separates the values of the characteristic amounts in the target points from the values of the characteristic amounts in the exclusion points on the basis of the frequency distributions of the values of the one or plural color characteristic amounts;

a process of setting, as the color condition, the kind(s) of the one or plural color characteristic amounts and the range of values of the color characteristic amounts;

a process of extracting a pixel area satisfying the color condition from each of a plurality of images of an acceptable IC component mounted in a normal position and a plurality of images of a defective IC component which is deviated;

a process of specifying an edge of each pixel area by an image process;

a process of obtaining a frequency distribution of values of characteristic amounts of the edge;

a process of obtaining a range of values of characteristic amounts which ideally separate values of characteristic amounts of an edge of a pixel area extracted from the images of the acceptable IC component from values of characteristic amounts of an edge of a pixel area extracted from the images of the defective IC component on the basis of the frequency distribution of values of the characteristic amounts; and a process of setting, as the determination condition, the kind of the characteristic amount and the range of values of the characteristic amount.

10. The program according to claim 9, wherein the kind of the color characteristic amount is preliminarily determined.

11. The program according to claim 9, wherein the processes further comprise:

a process of obtaining a plurality of color characteristic amount candidates constructed by one or plural color characteristic amounts;

a process of obtaining a range of values of color characteristic amounts that separate ideally the values of the color characteristic amounts in the target points from the values of the color characteristic amounts in the exclusion points and the degree of separation for each of the plurality of color characteristic amount candidates;

a process of selecting a color characteristic amount candidate employed as the color condition by comparing the degrees of separation; and a process of setting, as the color condition, the kind(s) of one or plural color characteristic amounts constructing the selected color characteristic amount candidate, and the range of values of the color characteristic amounts.

12. The program according to claim 9, wherein the kind of the characteristic amount is at least one of position and angle of the edge.

13. A method of setting an inspection logic for inspecting a PC board, the inspection logic including a color condition specifying a color appearing in a base part of each of leads arranged at an edge of body of a component to be inspected, and a determination condition, the method comprising:

a step of specifying a base part of a lead and a part adjacent to the lead base part from a captured image of an IC component mounted in a normal position;

a step of obtaining a frequency distribution of values of one or a plurality of color characteristic amounts in a plurality of target points and a plurality of exclusion points, the target points being pixels in the lead base part and the exclusion points being pixels in the part adjacent to the lead base part;

a step of obtaining a range of values of the color characteristic amounts that ideally separates the values of the characteristic amounts in the target points from the values of the characteristic amounts in the exclusion points on the basis of the frequency distributions of the values of the one or plural color characteristic amounts;

a step of setting, as the color condition, the kind(s) of the one or plural color characteristic amounts and the range of values of the color characteristic amounts;

a step of extracting a plurality of pixel areas satisfying the color condition from each of a plurality of images of an acceptable IC component mounted in a normal position and a plurality of images of a defective IC component which is deviated;

a step of specifying a straight line connecting the plurality of pixel areas by an image process;

a step of obtaining a frequency distribution of values of the characteristic amounts of the straight line;

a step of obtaining a range of values of characteristic amounts which ideally separate values of characteristic amounts of a straight line connecting a plurality of pixel areas extracted from the images of the acceptable IC component from values of characteristic amounts of a straight line connecting a plurality of pixel areas extracted from the images of the defective IC component on the basis of the frequency distribution of values of the characteristic amounts; and a step of setting, as the determination condition, the kind of the characteristic amounts and the range of values of the characteristic amounts.

14. The inspection logic setting method for a board inspecting apparatus according to claim 13, wherein the kind of the color characteristic amount is preliminarily determined.

15. The inspection logic setting method according to claim 13, further comprising:
    a step of obtaining a plurality of color characteristic amount candidates constructed by one or plural color characteristic amounts;
    a step of obtaining a range of values of color characteristic amounts that separate ideally the value of the color characteristic amount in the target point from the value of the color characteristic amount in the exclusion point and the degree of separation for each of the plurality of color characteristic amount candidates;
    a step of selecting a color characteristic amount candidate employed as the color condition by comparing the degrees of separation; and
    a step of setting, as the color condition, the kind(s) of one or plural color characteristic amounts constructing the selected color characteristic amount candidate, and a range of values of the color characteristic amounts.

16. The inspection logic setting method according to claim 13, wherein the kind of the characteristic amount is at least one of position and angle of the straight line.

17. An apparatus for generating an inspection logic for inspecting a PC board, comprising:
    a device that specifies a base part of a lead and a part adjacent to the lead base part by an imaging process from a captured image of an IC component mounted in a normal position;
    a device that obtains a frequency distribution of values of one or a plurality of color characteristic amounts in a plurality of target points and a plurality of exclusion points, the target points being pixels in the lead base part and the exclusion points being pixels in the part adjacent to the lead base part;
    a device that obtains a range of values of the one or plural color characteristic amounts that ideally separates the values of the characteristic amounts in the target points from the values of the characteristic amounts in the exclusion points on the basis of the frequency distributions of the values of the one or plural color characteristic amounts;
    a device that sets, as the color condition, the kind(s) of the one or plural color characteristic amounts and the range of values of the color characteristic amounts;
    a device that extracts a plurality of pixel areas satisfying the color condition from each of a plurality of images of an acceptable IC component mounted in a normal position and a plurality of images of a defective IC component which is deviated;
    a device that specifies a straight line connecting the plurality of pixel areas by an image process;
    a device that obtains a frequency distribution of values of the characteristic amounts of the straight line;
    a device that obtains a range of values of characteristic amounts which ideally separates values of characteristic amounts of a straight line connecting a plurality of pixel areas extracted from the image of the acceptable IC component from values of characteristic amounts of a straight line connecting a plurality of pixel areas extracted from the images of the defective IC component on the basis of the frequency distribution of values of the characteristic amounts; and
    a device that sets, as the determination condition, the kind of the characteristic amount and the range of values of the characteristic amount.

18. The inspection logic setting apparatus according to claim 17, wherein the kind of the color characteristic amount is preliminarily determined.

19. The inspection logic setting apparatus according to claim 17, further comprising:
    a device that obtains a plurality of color characteristic amount candidates constructed by one or a plurality of color characteristic amounts,
    wherein the device that obtains a frequency distribution of values of the color characteristic amounts obtains a frequency distribution of values of color characteristic amounts in the target points and the exclusion points with respect to each of the plurality of color characteristic amount candidates obtained by the device that obtains a plurality of color characteristic amount candidates,
    the device that obtains the range of values of color characteristic amounts obtains a range of values of color characteristic amounts that separate ideally the values of the color characteristic amounts in the target points from the values of the color characteristic amounts in the exclusion points, and the degrees of separation with respect to each of the plurality of color characteristic amount candidates, and
    the setting device selects a color characteristic amount candidate employed as the color condition by comparing the degrees of separation and sets, as the color condition, the kind(s) of one or plural color characteristic amounts constructing the selected color characteristic amount candidate, and the range of values of the color characteristic amounts.

20. An inspection logic setting apparatus according to claim 17, wherein the kind of the characteristic amount is at least one of position and angle of the edge.

21. A program stored on a tangible computer readable medium for generating an inspection logic for inspecting a PC board, and making an information processor execute processes the processes comprising:
    a process of specifying a part of a base part of a lead and a part adjacent to the lead base part by an image process from a captured image of an IC component mounted in a normal position;
    a process of obtaining a frequency distribution of values of one or a plurality of color characteristic amounts in a plurality of target points and a plurality of exclusion points, the target points being pixels in the lead base part and the exclusion points being pixels in the part adjacent to the lead base part;
    a process of obtaining a range of values of color characteristic amounts that ideally separates the values of the characteristic amounts in the target points from the values of the characteristic amounts in the exclusion points on the basis of the frequency distributions of the values of the one or plural color characteristic amounts;
    a process of setting, as the color condition, the kind(s) of the one or plural color characteristic amounts and the range of values of the color characteristic amounts;
    a process of extracting a plurality of pixel areas satisfying the color condition from a plurality of images of an acceptable IC component mounted in a normal position and a plurality of images of a defective IC component which is deviated;
    a process of specifying a straight line connecting the plurality of pixel areas by an image process;

a process of obtaining a frequency distribution of the values of the characteristic amounts of the straight line;

a process of obtaining a range of values of characteristic amounts which ideally separate values of characteristic amounts of a straight line connecting a plurality of pixel areas extracted from the images of the acceptable IC component from values of characteristic amounts of a straight line connecting a plurality of pixel areas extracted from the images of the defective IC component on the basis of the frequency distribution of values of the characteristic amounts; and a process of setting, as the determination condition, the kind of the characteristic amount and the range of values of the characteristic amounts.

22. The program according to claim 21, wherein the kind of the color characteristic amount is preliminarily determined.

23. The program according to claim 21, wherein the processes further comprise:

a process of obtaining a plurality of color characteristic amount candidates constructed by one or a plurality of color characteristic amounts;

a process of obtaining the range of values of color characteristic amounts that separates ideally the values of the color characteristic amounts in the target points from the values of the color characteristic amounts in the exclusion points and the degrees of separation for each of the plurality of color characteristic amount candidates;

a process of selecting a color characteristic amount candidate employed as the color condition by comparing the degrees of separation; and a process of setting, as the color condition, the kind(s) of one or plural color characteristic amounts constructing the selected color characteristic amount candidate, and the range of values of the color characteristic amounts.

24. The program according to claim 21, wherein the kind of the characteristic amount is at least one of position and angle of the straight line.

* * * * *